United States Patent
Zweigle et al.

(10) Patent No.: US 10,902,172 B2
(45) Date of Patent: Jan. 26, 2021

(54) SYSTEM AND METHOD OF AUTOMATIC RE-LOCALIZATION AND AUTOMATIC ALIGNMENT OF EXISTING NON-DIGITAL FLOOR PLANS

(71) Applicant: FARO Technologies, Inc., Lake Mary, FL (US)

(72) Inventors: Oliver Zweigle, Stuttgart (DE); Aleksej Frank, Stuttgart (DE); Joao Santos, Korntal-Münchingen (DE); Ahmad Ramadneh, Kornwestheim (DE)

(73) Assignee: FARO TECHNOLOGIES, INC., Lake Mary, FL (US)

( * ) Notice: Subject to any disclaimer, the term of this patent is extended or adjusted under 35 U.S.C. 154(b) by 16 days.

(21) Appl. No.: 16/101,660

(22) Filed: Aug. 13, 2018

(65) Prior Publication Data
US 2020/0050727 A1    Feb. 13, 2020

(51) Int. Cl.
G06F 30/39 (2020.01)
G06F 30/392 (2020.01)
G06T 11/00 (2006.01)
G01R 33/00 (2006.01)
G01C 19/00 (2013.01)
G01P 15/00 (2006.01)

(52) U.S. Cl.
CPC .......... *G06F 30/392* (2020.01); *G06T 11/005* (2013.01); *G01C 19/00* (2013.01); *G01P 15/00* (2013.01); *G01R 33/00* (2013.01)

(58) Field of Classification Search
None
See application file for complete search history.

(56) References Cited

U.S. PATENT DOCUMENTS

| | | | |
|---|---|---|---|
| 9,769,463 B2 | 9/2017 | Hillebrand et al. | |
| 10,390,003 B1 * | 8/2019 | Liu | G06T 5/002 |
| 2014/0043436 A1 | 2/2014 | Bell et al. | |
| 2014/0225985 A1 | 8/2014 | Klusza et al. | |

(Continued)

FOREIGN PATENT DOCUMENTS

| | | | |
|---|---|---|---|
| JP | 2015-518566 | * | 7/2015 |
| WO | 2014172484 A1 | | 10/2014 |

OTHER PUBLICATIONS

Machine translation for JP2015-518566 (Year: 2015).*

*Primary Examiner* — Qian Yang
(74) *Attorney, Agent, or Firm* — Cantor Colburn LLP

(57) ABSTRACT

A system and method of automatic re-localization of a handheld scanning device in a previously mapped environment is provided. The system includes a two-dimensional (2D) scanner and one or more processors operably coupled to the 2D scanner. The one or more processors are responsive to non-transitory executable instructions for performing operations that include determining a current location of the 2D scanner in an environment relative to a location in a previously generated 2D image of the environment. The operations also include generating a new 2D image of at least a subset of the environment based at least in part in response to a signal from a first sensor. The at least a subset of the environment includes the current location of the 2D scanner and at least one other location in the environment. The operations further include overlapping portions of the previously generated 2D image and the current 2D image.

18 Claims, 18 Drawing Sheets

(56) References Cited

U.S. PATENT DOCUMENTS

| | | |
|---|---|---|
| 2016/0073085 A1 | 3/2016 | Hillebrand et al. |
| 2016/0073091 A1 | 3/2016 | Hillebrand et al. |
| 2016/0073104 A1 | 3/2016 | Hillebrand et al. |
| 2018/0047208 A1 | 2/2018 | Marin et al. |
| 2018/0130255 A1 | 5/2018 | Hazeghi et al. |
| 2018/0285482 A1 | 10/2018 | Santos |
| 2019/0035100 A1* | 1/2019 | Ebrahimi Afrouzi .... G06K 9/20 |

* cited by examiner

SYSTEM AND METHOD OF AUTOMATIC RE-LOCALIZATION AND AUTOMATIC ALIGNMENT OF EXISTING NON-DIGITAL FLOOR PLANS

BACKGROUND

The present application is directed to optically scanning an environment, such as a building, and in particular to automatic re-localization and automatic alignment of existing non-digital floorplans.

The automated creation of digital two-dimensional floorplans for existing structures is desirable as it allows the size and shape of the environment to be used in many processes. For example, a floorplan may be desirable to allow construction drawings to be prepared during a renovation. Such floorplans may find other uses such as in documenting a building for a fire department or to document a crime scene.

Existing measurement systems typically use a scanning device that determines coordinates of surfaces in the environment by both emitting a light and capturing a reflection to determine a distance or by triangulation using cameras. These scanning devices are mounted to a movable structure, such as a cart, and moved through the building to generate a digital representation of the building. These systems tend to be more complex and require specialized personnel to perform the scan. Further, the scanning equipment including the movable structure may be bulky, which could further delay the scanning process in time sensitive situations, such as a crime or accident scene investigation.

Handheld scanning devices can be used instead of scanning devices that are mounted to a movable structure. However, when using a hand held scanning device to map an environment, the user needs to be careful when stopping the mapping session since it is not possible to resume the mapping session once it has been stopped.

Accordingly, while existing scanners are suitable for their intended purposes, what is needed is a system for having certain features of embodiments of the present invention.

BRIEF DESCRIPTION

According to one aspect of the invention, a system for automatic re-localization of a handheld scanning device in a previously mapped environment is provided. The system includes a two-dimensional (2D) scanner that includes a light source, an image sensor and a controller. The light source steers a beam of light within the first plane to illuminate object points in the environment. The image sensor is arranged to receive light reflected from the object points. The controller is operable to determine a distance value to at least one of the object points. The 2D scanner also includes an inertial measurement unit fixedly coupled relative to the 2D scanner and having a first sensor. The inertial measurement unit generates a signal in response a change in position or orientation of the housing, and the first sensor has a first characteristic. The system also includes one or more processors operably coupled to the 2D scanner. The one or more processors are responsive to non-transitory executable instructions for performing operations that include determining a current location of the 2D scanner in an environment relative to a location in a previously generated 2D image of the environment. The operations also include generating a new 2D image of at least a subset of the environment based at least in part in response to a signal from the first sensor, the at least a subset of the environment includes the current location of the 2D scanner and at least one other location in the environment. The operations further include overlapping portions of the previously generated 2D image and the current 2D image.

In addition to one or more of the features described herein, or as an alternative, further embodiments of the system may include computing virtual scan data based at least in part on a point of view of the location in a previously generated 2D image of the environment; obtaining current scan data from the 2D scanner at the current location; and comparing the virtual scan data to the current scan data. Based on the virtual scan data not matching the current scan data, the point of view of the location in a previously generated 2D image of the environment can be modified, and the computing, obtaining, and comparing are repeated.

In addition to one or more of the features described herein, or as an alternative, further embodiments of the system may include that the virtual scan data matches the current scan data when the virtual scan data is within a threshold value of the current scan data.

In addition to one or more of the features described herein, or as an alternative, further embodiments of the system may include that the repeating is performed until the virtual scan data matches the current scan data.

In addition to one or more of the features described herein, or as an alternative, further embodiments of the system may include that the current location is estimated by a user to be a starting point of the previously generated 2D image, and that the combining includes aligning the previously generated 2D image and the current 2D image using a root means square method.

In addition to one or more of the features described herein, or as an alternative, further embodiments of the system may include a mobile computing device coupled to the 2D scanner, and the current location of the 2D scanner relative to a location in a previously generated 2D image is determined by an augmented reality application executing on the mobile computing device.

In addition to one or more of the features described herein, or as an alternative, further embodiments of the system may include that the previously generated 2D image of the environment was created based on a photograph.

In addition to one or more of the features described herein, or as an alternative, further embodiments of the system may include that the previously generated 2D image of the environment was created by a 2D scanner.

In addition to one or more of the features described herein, or as an alternative, further embodiments of the system may include that the 2D image is a floorplan of a building.

In addition to one or more of the features described herein, or as an alternative, further embodiments of the system may include that the first sensor is selected from a group that includes: an accelerometer, a gyroscope and a magnetometer.

In addition to one or more of the features described herein, or as an alternative, further embodiments of the system may include that the first sensor is a camera.

According to another aspect of the invention, a method for automatic re-localization of a handheld scanning device is a previously mapped environment is provided. The method includes determining a current location of a 2D scanner in an environment relative to a location in a previously generated 2D image of the environment. The 2D scanner includes a light source, an image sensor and a controller. The light source steers a beam of light within the first plane to illuminate object points in the environment. The image sensor is arranged to receive light reflected from the object points. The controller is operable to determine a distance value to at least one of the object points. The 2D scanner also includes an inertial measurement unit fixedly coupled relative to the 2D scanner and having a first sensor. The inertial measurement unit generates a signal in response to a change in position or orientation of the housing. The first sensor has a first characteristic. A new 2D image of at least a subset of the environment is generated based at least in part in response to a signal from the first sensor. The at least a subset of the environment includes the current location of the 2D scanner and at least one other location in the environment. The overlapping portions of the previously generated 2D image are combined with the current 2D image.

In addition to one or more of the features described herein, or as an alternative, further embodiments of the method may include computing virtual scan data based at least in part on a point of view of the location in a previously generated 2D image of the environment; obtaining current scan data from the 2D scanner at the current location; and comparing the virtual scan data to the current scan data. Based on the virtual scan data not matching the current scan data, the point of view of the location in a previously generated 2D image of the environment can be modified, and the computing, obtaining, and comparing are repeated.

In addition to one or more of the features described herein, or as an alternative, further embodiments of the method may include that the virtual scan data matches the current scan data when the virtual scan data is within a threshold value of the current scan data.

In addition to one or more of the features described herein, or as an alternative, further embodiments of the method may include that the repeating is performed until the virtual scan data matches the current scan data.

In addition to one or more of the features described herein, or as an alternative, further embodiments of the method may include that the current location is estimated by a user to be a starting point of the previously generated 2D image, and that the combining includes aligning the previously generated 2D image and the current 2D image using a root means square method.

In addition to one or more of the features described herein, or as an alternative, further embodiments of the method may include a mobile computing device coupled to the 2D scanner, and the current location of the 2D scanner relative to a location in a previously generated 2D image is determined by an augmented reality application executing on the mobile computing device.

In addition to one or more of the features described herein, or as an alternative, further embodiments of the method may include that the previously generated 2D image of the environment was created based on a photograph.

In addition to one or more of the features described herein, or as an alternative, further embodiments of the method may include that the previously generated 2D image of the environment was created by a 2D scanner.

In addition to one or more of the features described herein, or as an alternative, further embodiments of the method may include that the 2D image is a floorplan of a building.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

Figure 1:
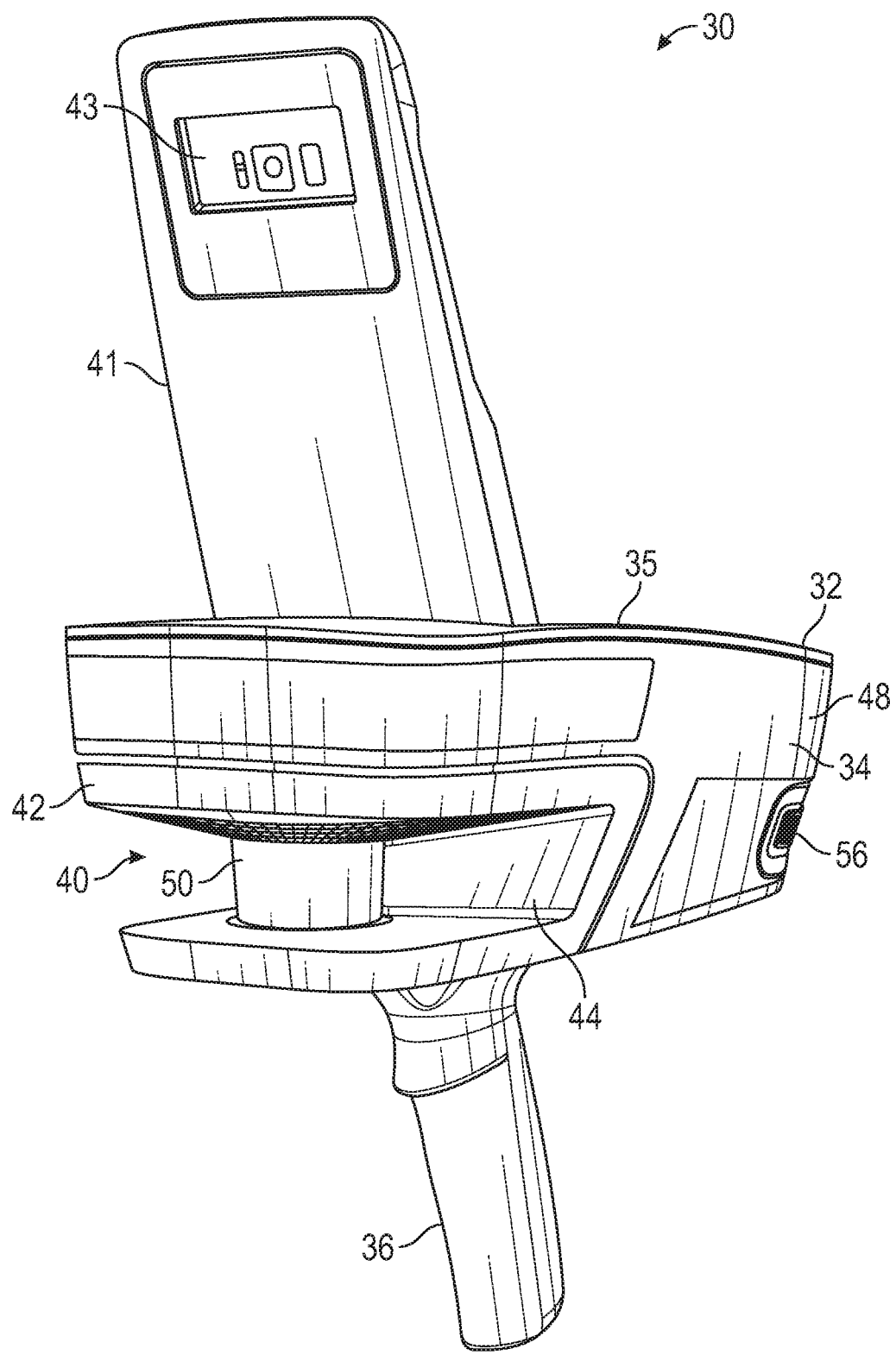
FIGS. 1-3 are perspective views of a scanning and mapping system in accordance with an embodiment.
Figure 2:
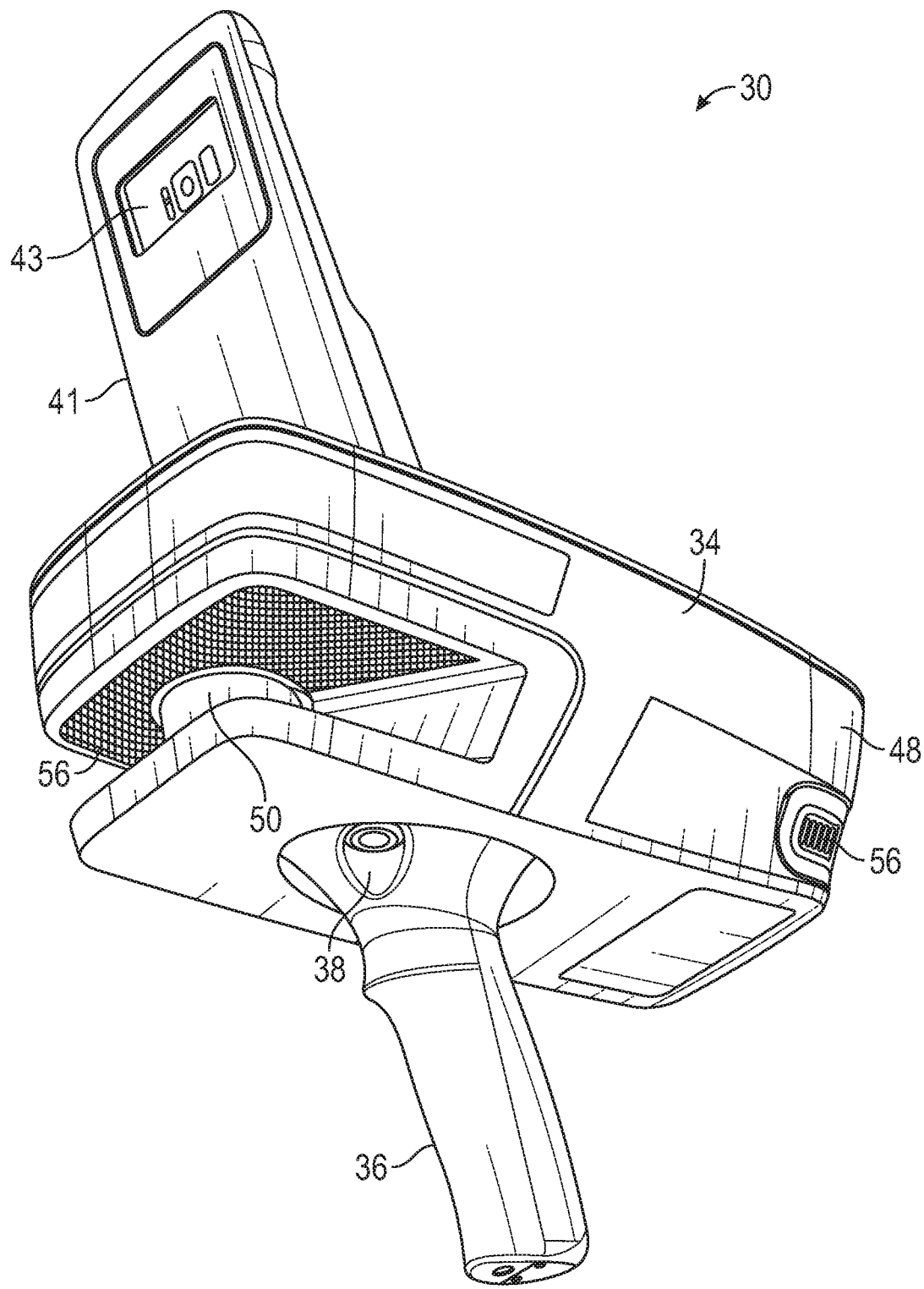
Figure 3:
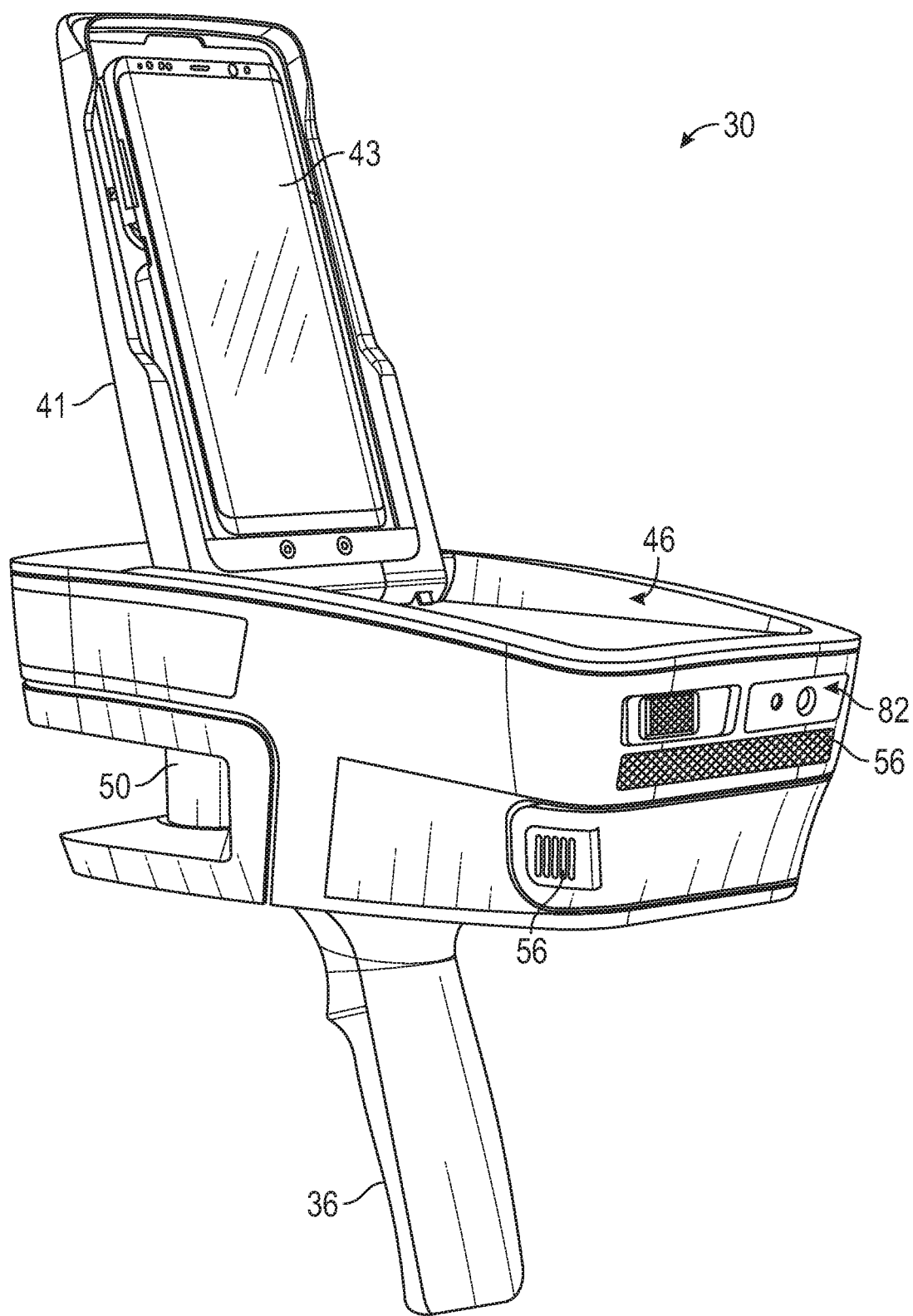
Figure 4:
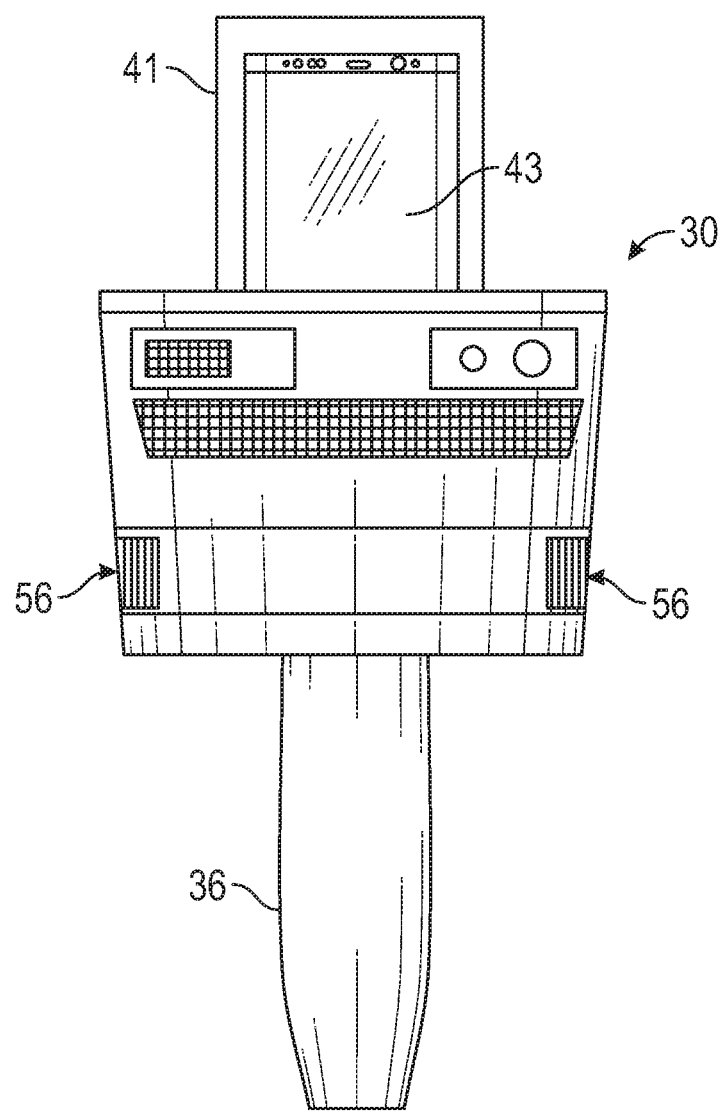
FIG. 4 is a first end view of the system of FIG. 1.
Figure 5:
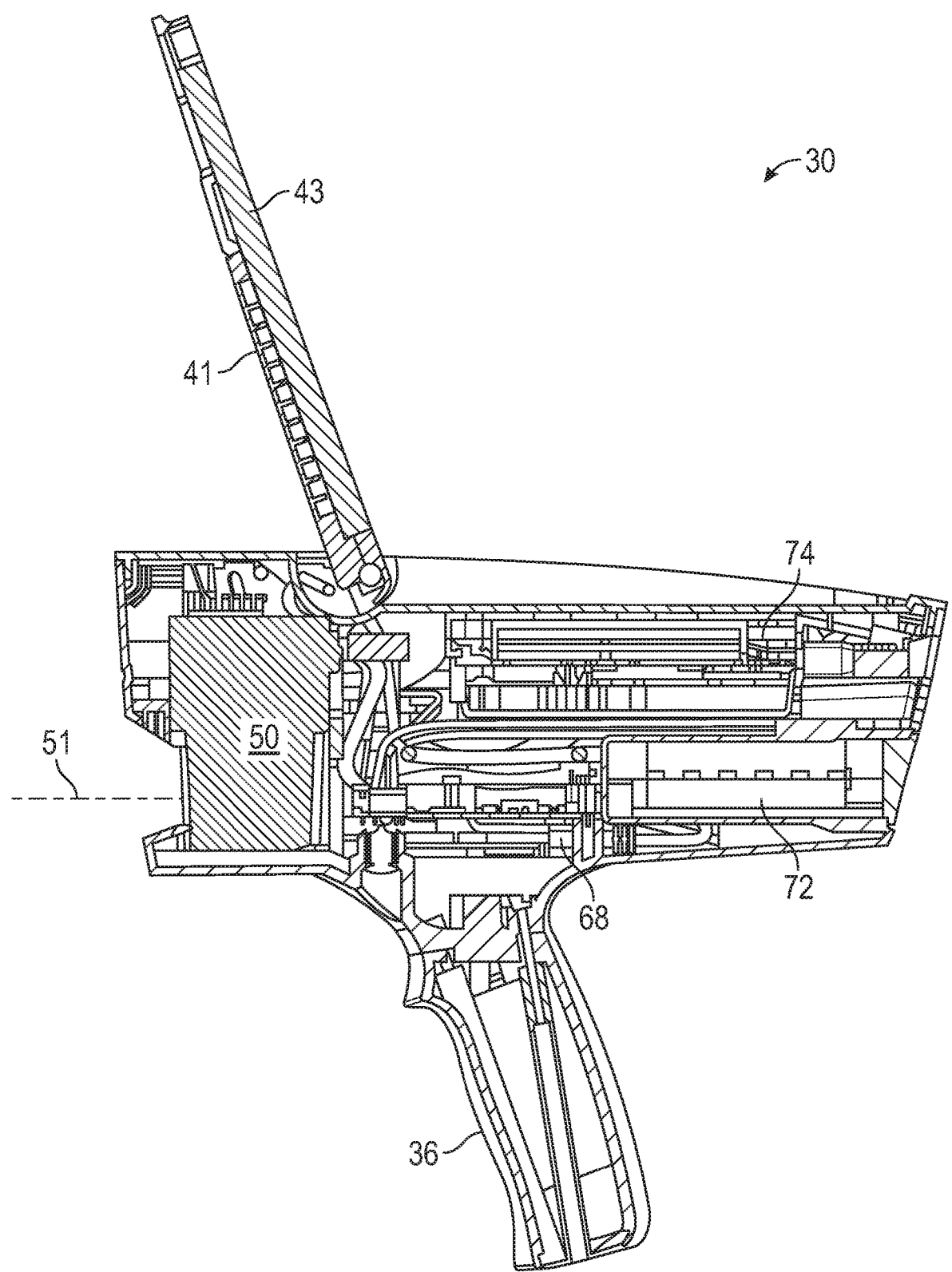
FIG. 5 is a side sectional view of the system of FIG. 1.
Figure 7:
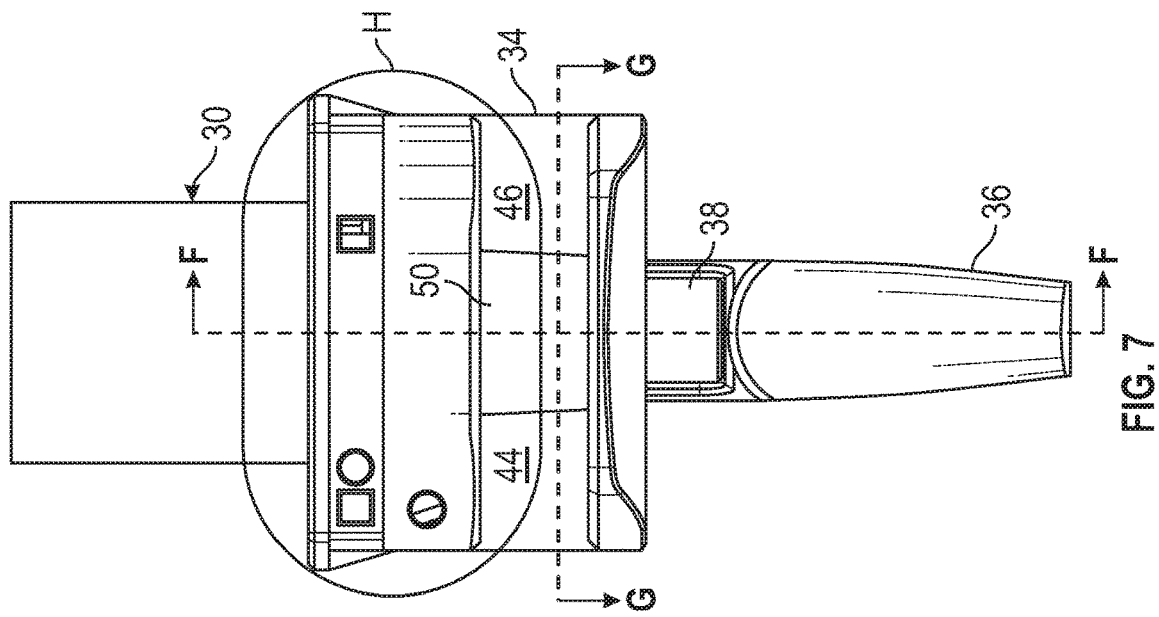
FIG. 7 is a first end view of the system of FIG. 6.

The detailed description explains embodiments of the invention, together with advantages and features, by way of example with reference to the drawings.

DETAILED DESCRIPTION

Handheld scanning devices can be powerful tools that enable the easy creation of two-dimensional (2D) floorplans of any indoor environment. As described above, when performing a mapping task, the user of a prior art handheld scanning device needs to be careful when stopping the mapping session, since it is not possible to resume the mapping session. This is due to a well-known problem in the robotics community referred to as the "kidnapped robot" problem which occurs when the mapping device or autonomous agent is moved to an arbitrary location while it is not sensing the environment. This problem affects any device, or agent, that relies on maps, both three-dimensional (3D) and 2D, to localize and navigate in a given environment. The device does not have any a priori information about the environment nor is it able to track its positions while "down", or non-operational, and consequently when the device starts operating again it is not aware of its location in the environment.

With a handheld scanning device, as soon as the user stops mapping the environment (e.g., stops a mapping session) the handheld scanning device is not able to keep track of its position over time and consequently is not able to relate the incoming sensor data with previously mapped areas. As used herein the term "mapping session" refers to using the handheld scanning device to build a 2D floorplan and optionally adding notes to it at a given time. A new mapping session occurs every time that the user builds a 2D floorplan of the same space, or environment. Therefore each mapping session occurs at a different point in time.

As used herein, the terms "re-localize" or "localize" are used interchangeably herein to refer to determining a current location of a handheld scanning device relative to contents of a floorplan, or map, generated during a previous mapping sessions. Re-localization, or localization, is performed so that data from two different mapping sessions can be combined to generate a single floorplan and/or for updating a previously generated floorplan.

The technical problem of how to re-localize a handheld scanning device in a previously mapped environment is addressed by an embodiment of the present invention by providing an iterative approach that includes modifying an estimated point of view of the handheld scanning device until data currently being read from the handheld scanning device matches (e.g., is within a threshold value) virtual laser scan reading data that is computed based on the estimated point of view. This approach automates the re-localization in order to allow two or more mapping sessions to be combined to create a 2D floorplan of an environment. In addition, the ability to re-localize a handheld scanning device in a previously mapped environment can allow previous floorplans to be updated without mapping the whole environment again.

The technical problem of how to re-localize a handheld scanning device in a previously mapped environment is addressed by an alternate embodiment by requesting that the user start a new mapping session in the same location that a previous mapping session was started. Relative poses between the two mapping sessions are identified so that the mapping sessions can be combined.

The technical problem of how to re-localize a handheld scanning device in a previously mapped environment is addressed by another alternate embodiment by using an augmented reality (AR) framework executing on a smartphone mounted on the handheld scanning device. Commercially available AR frameworks use visual simultaneous localization and mapping methods to track a smartphone in an environment and to re-localize the smartphone in the environment. An advantage to this approach is that commercially available software executing on a smartphone can be utilized in order to allow two or more mapping sessions to be combined to create a 2D floorplan of an environment. In addition, the ability to re-localize a handheld scanning device in a previously mapped environment can allow previous floorplans to be updated without mapping the whole environment again.

The technical problem of providing a scale of a non-digital floor plan and not being able to use the non-digital floor plan in combination with scan data to generate a floorplan is addressed by an embodiment at least by providing a photograph of a scale or ruler next to the non-digital floorplan. Using the scale, an occupancy grid can be created for the non-digital floorplan. The resulting occupancy grid can be used to combine a non-digital (e.g., paper) floorplan with mapping session data to create a 2D floorplan of an environment. In addition, the ability to localize a handheld scanning device with the non-digital floorplan can allow the non-digital floorplan to be updated without mapping the whole environment covered by the non-digital floorplan.

The technical problem of providing a scale of a non-digital floor plan and not being able to use the non-digital floor plan in combination with scan data to generate a floorplan is addressed by an embodiment at least by providing the user with current laser readings over an occupancy grid and allowing the user to adjust the scale to match the occupancy grid. This can allow an occupancy grid to be created for the non-digital floorplan and for the resulting occupancy grid to be to combine a non-digital floorplan with mapping session data to create a 2D floorplan of an environment. In addition, the ability to localize a handheld scanning device with the non-digital (e.g., paper) floorplan can allow the non-digital floorplan to be updated without mapping the whole environment covered by the non-digital floorplan.

Embodiments herein relate to a device that includes a system having a 2D scanner that works cooperatively with an inertial measurement unit to generate an annotated two-dimensional map of an environment.

Referring now to FIGS. 1-5, an embodiment of a system 30 having a housing 32 that includes a body portion 34 and a handle portion 36. In an embodiment, the handle 36 may include an actuator 38 that allows the operator to interact with the system 30. In the exemplary embodiment, the body 34 includes a generally rectangular center portion 35 with a slot 40 formed in an end 42. The slot 40 is at least partially defined by a pair of walls 44 that are angled towards a second end 48. As will be discussed in more detail herein, a portion of a two-dimensional scanner 50 is arranged between the walls 44. The walls 44 are angled to allow the scanner 50 to operate by emitting a light over a large angular area without interference from the walls 44. As will be discussed in more detail herein, the end 42 may further include a three-dimensional camera or RGBD camera 60.

Figure 10:
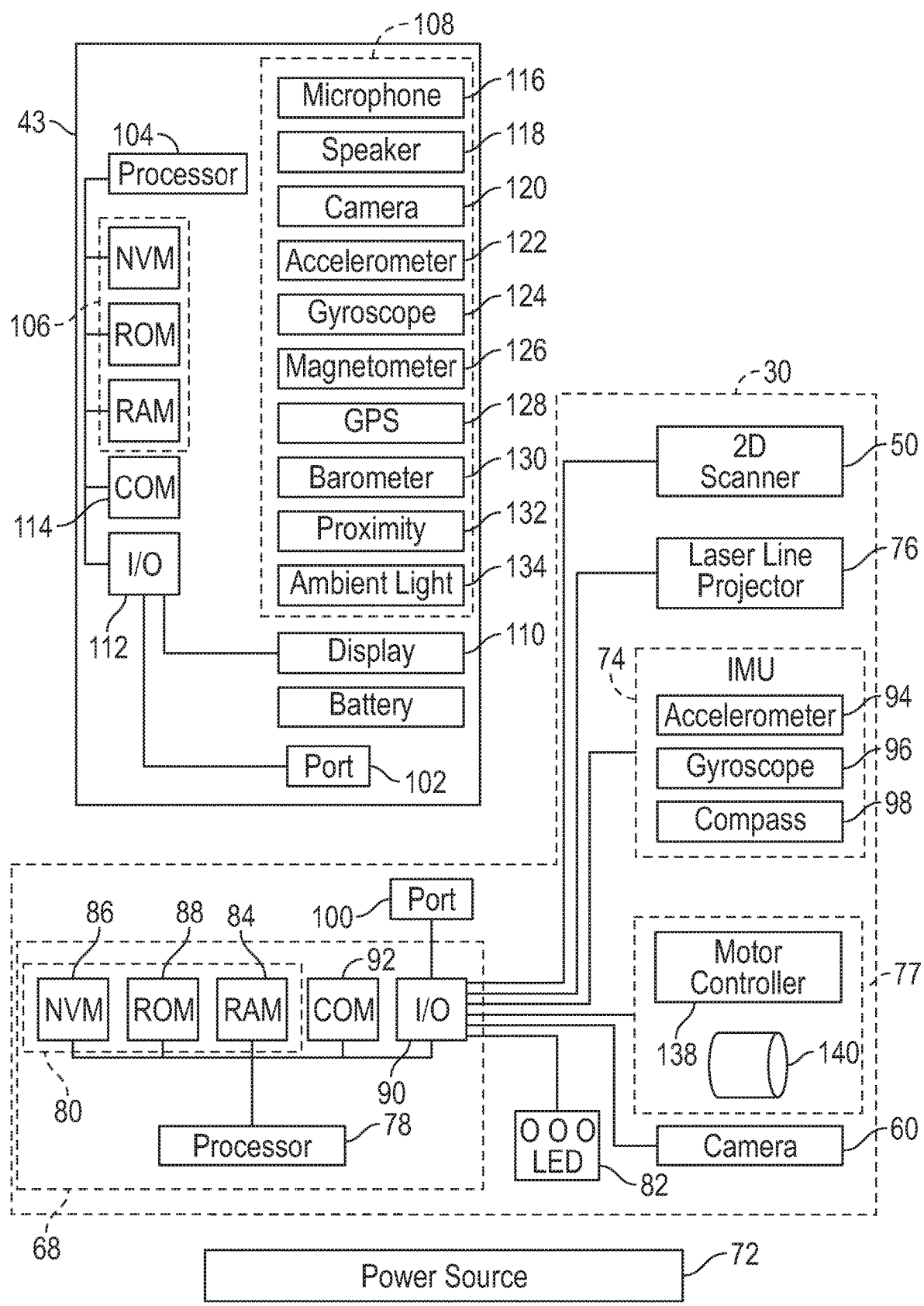
FIG. 10 is a block diagram of the system of FIG. 1 and FIG. 6.

Extending from the center portion 35 is a mobile device holder 41. The mobile device holder 41 is configured to securely couple a mobile device 43 to the housing 32. The holder 41 may include one or more fastening elements, such as a magnetic or mechanical latching element for example, that couples the mobile device 43 to the housing 32. In an embodiment, the mobile device 43 is coupled to communicate with a controller 68 (FIG. 10). The communication between the controller 68 and the mobile device 43 may be via any suitable communications medium, such as wired, wireless or optical communication mediums for example.

In the illustrated embodiment, the holder 41 is pivotally coupled to the housing 32, such that it may be selectively rotated into a closed position within a recess 46. In an embodiment, the recess 46 is sized and shaped to receive the holder 41 with the mobile device 43 disposed therein.

Figure 6:
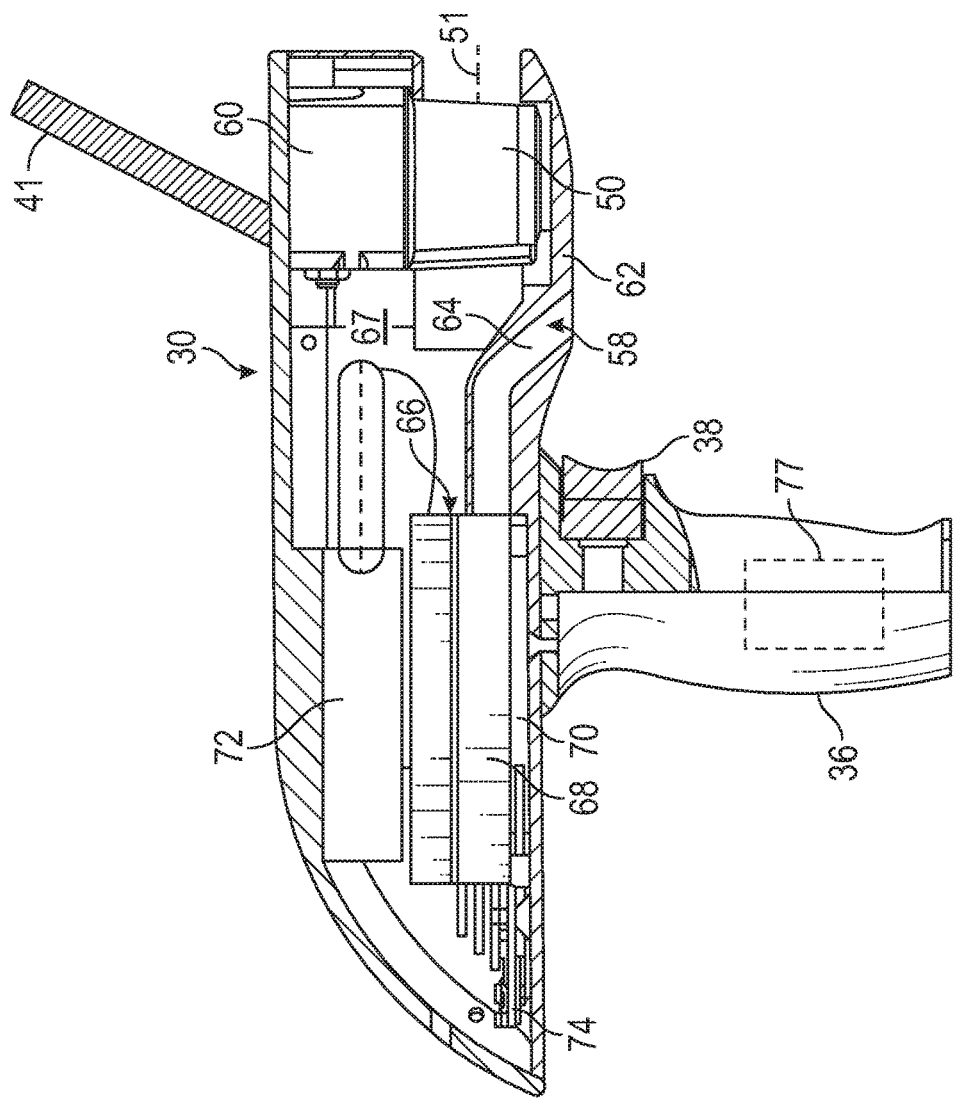
FIG. 6 is a side sectional view of the system of a scanning and mapping system in accordance with another embodiment.
Figure 8:
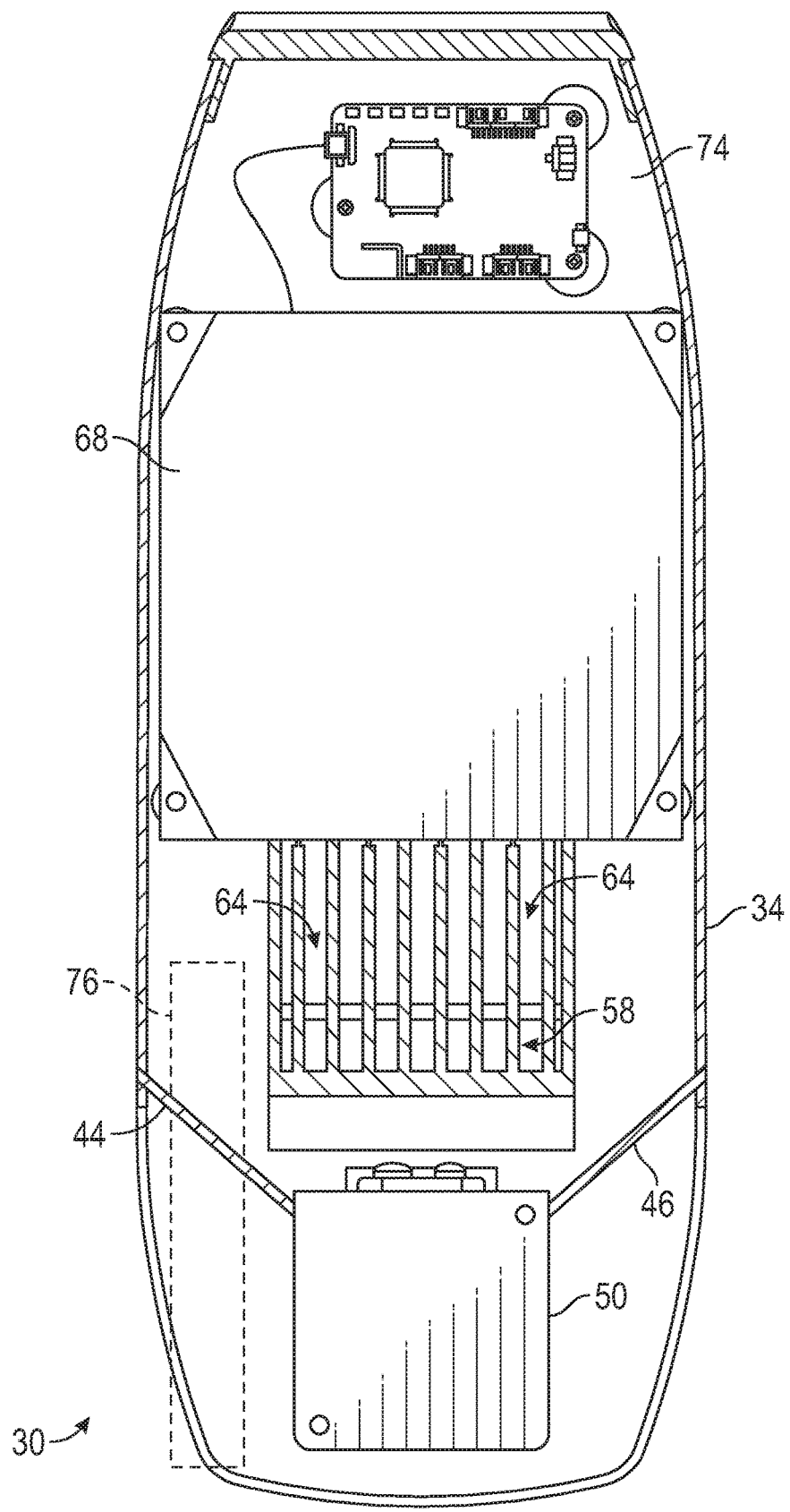
FIG. 8 is a top sectional view of the system of FIG. 6.
Figure 9:
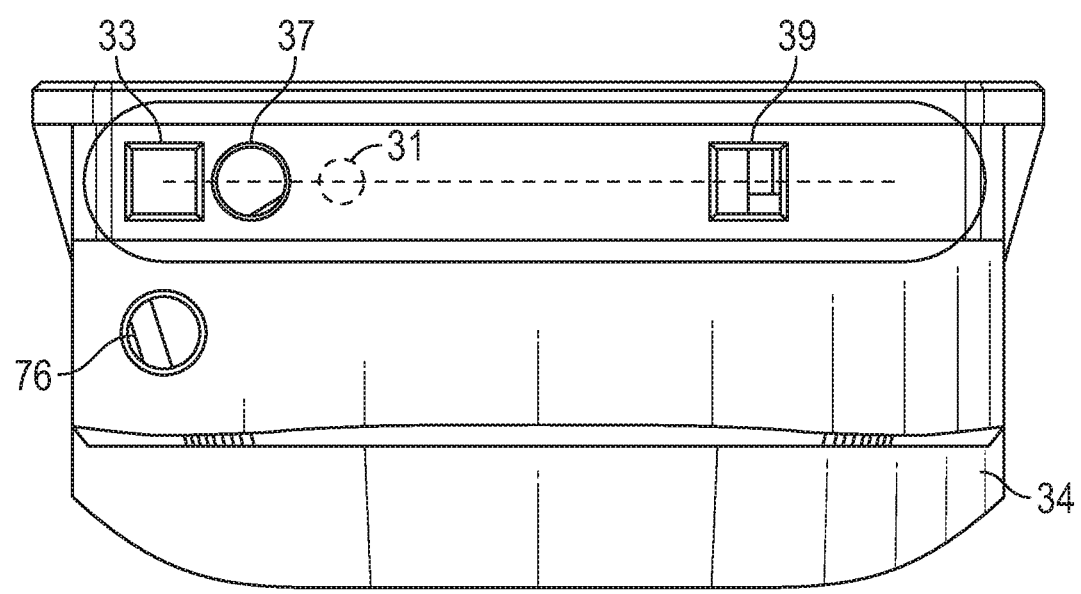
FIG. 9 is an enlarged view of a portion of the second end of FIG. 7.

In the exemplary embodiment, the second end 48 includes a plurality of exhaust vent openings 56. In an embodiment, shown in FIGS. 6-9, the exhaust vent openings 56 are fluidly coupled to intake vent openings 58 arranged on a bottom surface 62 of center portion 35. The intake vent openings 58 allow external air to enter a conduit 64 having an opposite opening 66 (FIG. 6) in fluid communication with the hollow interior 67 of the body 34. In an embodiment, the opening 66 is arranged adjacent to a controller 68 which has one or more processors that is operable to perform the methods described herein. In an embodiment, the external air flows from the opening 66 over or around the controller 68 and out the exhaust vent openings 56.

The controller 68 is coupled to a wall 70 of body 34. In an embodiment, the wall 70 is coupled to or integral with the handle 36. The controller 68 is electrically coupled to the 2D scanner 50, the 3D camera 60, a power source 72, an inertial measurement unit (IMU) 74, a laser line projector 76, and a haptic feedback device 77.

Referring now to FIG. 10 with continuing reference to FIGS. 1-9, elements are shown of the system 30 with the mobile device 43 installed or coupled to the housing 32. Controller 68 is a suitable electronic device capable of accepting data and instructions, executing the instructions to process the data, and presenting the results. The controller 68 includes one or more processing elements 78. The processors may be microprocessors, field programmable gate arrays (FPGAs), digital signal processors (DSPs), and generally any device capable of performing computing functions. The one or more processors 78 have access to memory 80 for storing information.

Controller 68 is capable of converting the analog voltage or current level provided by 2D scanner 50, camera 60 and IMU 74 into a digital signal to determine a distance from the system 30 to an object in the environment. In an embodiment, the camera 60 is a 3D or RGBD type camera. Controller 68 uses the digital signals that act as input to various processes for controlling the system 30. The digital signals represent one or more system 30 data including but not limited to distance to an object, images of the environment, acceleration, pitch orientation, yaw orientation and roll orientation. As will be discussed in more detail, the digital signals may be from components internal to the housing 32 or from sensors and devices located in the mobile device 43.

In general, when the mobile device 43 is not installed, controller 68 accepts data from 2D scanner 50 and IMU 74 and is given certain instructions for the purpose of generating a two-dimensional map of a scanned environment. Controller 68 provides operating signals to the 2D scanner 50, the camera 60, laser line projector 76 and haptic feedback device 77. Controller 68 also accepts data from IMU 74, indicating, for example, whether the operator is operating in the system in the desired orientation. The controller 68 compares the operational parameters to predetermined variances (e.g. yaw, pitch or roll thresholds) and if the predetermined variance is exceeded, generates a signal that activates the haptic feedback device 77. The data received by the controller 68 may be displayed on a user interface coupled to controller 68. The user interface may be one or more LEDs (light-emitting diodes) 82, an LCD (liquid-crystal diode) display, a CRT (cathode ray tube) display, or the like. A keypad may also be coupled to the user interface for providing data input to controller 68. In one embodiment, the user interface is arranged or executed on the mobile device 43.

The controller 68 may also be coupled to external computer networks such as a local area network (LAN) and the Internet. A LAN interconnects one or more remote computers, which are configured to communicate with controller 68 using a well-known computer communications protocol such as TCP/IP (Transmission Control Protocol/Internet(ˆ) Protocol), RS-232, ModBus, and the like. Additional systems 30 may also be connected to LAN with the controllers 68 in each of these systems 30 being configured to send and receive data to and from remote computers and other systems 30. The LAN may be connected to the Internet. This connection allows controller 68 to communicate with one or more remote computers connected to the Internet.

The processors 78 are coupled to memory 80. The memory 80 may include random access memory (RAM) device 84, a non-volatile memory (NVM) device 86, a read-only memory (ROM) device 88. In addition, the processors 78 may be connected to one or more input/output (I/O) controllers 90 and a communications circuit 92. In an embodiment, the communications circuit 92 provides an interface that allows wireless or wired communication with one or more external devices or networks, such as the LAN discussed above.

Controller 68 includes operation control methods embodied in application code shown or described with reference to FIGS. 11-14 and FIG. 19. These methods are embodied in computer instructions written to be executed by processors 78, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C #, Objective-C, Visual C++, Java, ALGOL (algorithmic language), BASIC (beginners all-purpose symbolic instruction code), visual BASIC, ActiveX, HTML (Hyper-Text Markup Language), Python, Ruby and any combination or derivative of at least one of the foregoing.

Coupled to the controller 68 is the 2D scanner 50. The 2D scanner 50 measures 2D coordinates in a plane. In the exemplary embodiment, the scanning is performed by steering light within a plane to illuminate object points in the environment. The 2D scanner 50 collects the reflected (scattered) light from the object points to determine 2D coordinates of the object points in the 2D plane. In an embodiment, the 2D scanner 50 scans a spot of light over an angle while at the same time measuring an angle value and corresponding distance value to each of the illuminated object points.

Examples of 2D scanners 50 include, but are not limited to Model LMS100 scanners manufactured by Sick, Inc of Minneapolis, Minn. and scanner Models URG-04LX-UG01 and UTM-30LX manufactured by Hokuyo Automatic Co., Ltd of Osaka, Japan. The scanners in the Sick LMS100 family measure angles over a 270 degree range and over distances up to 20 meters. The Hoyuko model URG-04LX-UG01 is a low-cost 2D scanner that measures angles over a 240 degree range and distances up to 4 meters. The Hoyuko model UTM-30LX is a 2D scanner that measures angles over a 270 degree range and to distances up to 30 meters. It should be appreciated that the above 2D scanners are exemplary and other types of 2D scanners are also available.

In an embodiment, the 2D scanner 50 is oriented so as to scan a beam of light over a range of angles in a generally horizontal plane (relative to the floor of the environment being scanned). At instants in time the 2D scanner 50 returns an angle reading and a corresponding distance reading to provide 2D coordinates of object points in the horizontal plane. In completing one scan over the full range of angles, the 2D scanner returns a collection of paired angle and distance readings. As the system 30 is moved from place to place, the 2D scanner 50 continues to return 2D coordinate values. These 2D coordinate values are used to locate the position of the system 30 thereby enabling the generation of a two-dimensional map or floorplan of the environment.

Also coupled to the controller 86 is the IMU 74. The IMU 74 is a position/orientation sensor that may include accelerometers 94 (inclinometers), gyroscopes 96, a magnetometers or compass 98, and altimeters. In the exemplary embodiment, the IMU 74 includes multiple accelerometers 94 and gyroscopes 96. The compass 98 indicates a heading based on changes in magnetic field direction relative to the earth's magnetic north. The IMU 74 may further have an altimeter that indicates altitude (height). An example of a widely used altimeter is a pressure sensor. By combining readings from a combination of position/orientation sensors with a fusion algorithm that may include a Kalman filter, relatively accurate position and orientation measurements can be obtained using relatively low-cost sensor devices. In the exemplary embodiment, the IMU 74 determines the pose or orientation of the system 30 about three-axis to allow a determination of a yaw, roll and pitch parameter.

In the embodiment shown in FIGS. 6-9, the system 30 further includes a camera 60 that is a 3D or RGB-D camera. As used herein, the term 3D camera refers to a device that produces a two-dimensional image that includes distances to a point in the environment from the location of system 30. The 3D camera 30 may be a range camera or a stereo camera. In an embodiment, the 3D camera 30 includes an RGB-D sensor that combines color information with a per-pixel depth information. In an embodiment, the 3D camera 30 may include an infrared laser projector 31 (FIG. 9), a left infrared camera 33, a right infrared camera 39, and a color camera 37. In an embodiment, the 3D camera 60 is a RealSense™ camera model R200 manufactured by Intel Corporation.

In an embodiment, when the mobile device 43 is coupled to the housing 32, the mobile device 43 becomes an integral part of the system 30. In an embodiment, the mobile device 43 is a cellular phone, a tablet computer or a personal digital assistant (PDA). The mobile device 43 may be coupled for communication via a wired connection, such as ports 100, 102. The port 100 is coupled for communication to the processor 78, such as via I/O controller 90 for example. The ports 100, 102 may be any suitable port, such as but not limited to USB, USB-A, USB-B, USB-C, IEEE 1394 (Firewire), or Lightning™ connectors.

The mobile device 43 is a suitable electronic device capable of accepting data and instructions, executing the instructions to process the data, and presenting the results. The mobile device 43 includes one or more processing elements 104. The processors may be microprocessors, field programmable gate arrays (FPGAs), digital signal processors (DSPs), and generally any device capable of performing computing functions. The one or more processors 104 have access to memory 106 for storing information.

The mobile device 43 is capable of converting the analog voltage or current level provided by sensors 108 and processor 78. Mobile device 43 uses the digital signals that act as input to various processes for controlling the system 30. The digital signals represent one or more system 30 data including but not limited to distance to an object, images of the environment, acceleration, pitch orientation, yaw orientation, roll orientation, global position, ambient light levels, and altitude for example.

In general, mobile device 43 accepts data from sensors 108 and is given certain instructions for the purpose of generating or assisting the processor 78 in the generation of a two-dimensional map or three-dimensional map of a scanned environment. Mobile device 43 provides operating signals to the processor 78, the sensors 108 and a display 110. Mobile device 43 also accepts data from sensors 108, indicating, for example, to track the position of the mobile device 43 in the environment or measure coordinates of points on surfaces in the environment. The mobile device 43 compares the operational parameters to predetermined variances (e.g. yaw, pitch or roll thresholds) and if the predetermined variance is exceeded, may generate a signal. The data received by the mobile device 43 may be displayed on display 110. In an embodiment, the display 110 is a touch screen device that allows the operator to input data or control the operation of the system 30.

The controller 68 may also be coupled to external networks such as a local area network (LAN), a cellular network and the Internet. A LAN interconnects one or more remote computers, which are configured to communicate with controller 68 using a well-known computer communications protocol such as TCP/IP (Transmission Control Protocol/Internee) Protocol), RS-232, ModBus, and the like. Additional systems 30 may also be connected to LAN with the controllers 68 in each of these systems 30 being configured to send and receive data to and from remote computers and other systems 30. The LAN may be connected to the Internet. This connection allows controller 68 to communicate with one or more remote computers connected to the Internet.

The processors 104 are coupled to memory 106. The memory 106 may include random access memory (RAM) device, a non-volatile memory (NVM) device, and a read-only memory (ROM) device. In addition, the processors 104 may be connected to one or more input/output (I/O) controllers 112 and a communications circuit 114. In an embodiment, the communications circuit 114 provides an interface that allows wireless or wired communication with one or more external devices or networks, such as the LAN or the cellular network discussed above.

Controller 68 includes operation control methods embodied in application code shown or described with reference to FIGS. 11-4 and FIG. 19-24. These methods are embodied in computer instructions written to be executed by processors 78, 104, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C #, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing.

Also coupled to the processor 104 are the sensors 108. The sensors 108 may include but are not limited to: a microphone 116; a speaker 118; a front or rear facing camera 120; accelerometers 122 (inclinometers), gyroscopes 124, a magnetometers or compass 126; a global positioning satellite (GPS) module 128; a barometer 130; a proximity sensor 132; and an ambient light sensor 134. By combining readings from a combination of sensors 108 with a fusion algorithm that may include a Kalman filter, relatively accurate position and orientation measurements can be obtained.

It should be appreciated that the sensors 60, 74 integrated into the scanner 30 may have different characteristics than the sensors 108 of mobile device 43. For example, the resolution of the cameras 60, 120 may be different, or the accelerometers 94, 122 may have different dynamic ranges, frequency response, sensitivity (mV/g) or temperature parameters (sensitivity or range). Similarly, the gyroscopes 96, 124 or compass/magnetometer may have different characteristics. It is anticipated that in some embodiments, one or more sensors 108 in the mobile device 43 may be of higher accuracy than the corresponding sensors 74 in the system 30. As described in more detail herein, in some embodiments the processor 78 determines the characteristics of each of the sensors 108 and compares them with the corresponding sensors in the system 30 when the mobile device. The processor 78 then selects which sensors 74, 108 are used during operation. In some embodiments, the mobile device 43 may have additional sensors (e.g. microphone 116, camera 120) that may be used to enhance operation compared to operation of the system 30 without the mobile device 43. In still further embodiments, the system 30 does not include the IMU 74 and the processor 78 uses the sensors 108 for tracking the position and orientation/pose of the system 30. In still further embodiments, the addition of the mobile device 43 allows the system 30 to utilize the camera 120 to perform three-dimensional (3D) measurements either directly (using an RGB-D camera) or using photogrammetry techniques to generate 3D maps. In an embodiment, the processor 78 uses the communications circuit (e.g. a cellular 4G internet connection) to transmit and receive data from remote computers or devices.

In the exemplary embodiment, the system 30 is a handheld portable device that is sized and weighted to be carried by a single person during operation. Therefore, the plane 136 (FIG. 18) in which the 2D scanner 50 projects a light beam may not be horizontal relative to the floor or may continuously change as the computer moves during the scanning process. Thus, the signals generated by the accelerometers 94, gyroscopes 96 and compass 98 (or the corresponding sensors 108) may be used to determine the pose (yaw, roll, tilt) of the system 30 and determine the orientation of the plane 51.

In an embodiment, it may be desired to maintain the pose of the system 30 (and thus the plane 136) within predetermined thresholds relative to the yaw, roll and pitch orientations of the system 30. In an embodiment, a haptic feedback device 77 is disposed within the housing 32, such as in the handle 36. The haptic feedback device 77 is a device that creates a force, vibration or motion that is felt or heard by the operator. The haptic feedback device 77 may be, but is not limited to: an eccentric rotating mass vibration motor or a linear resonant actuator for example. The haptic feedback device is used to alert the operator that the orientation of the light beam from 2D scanner 50 is equal to or beyond a predetermined threshold. In operation, when the IMU 74 measures an angle (yaw, roll, pitch or a combination thereof), the controller 68 transmits a signal to a motor controller 138 that activates a vibration motor 140. Since the vibration originates in the handle 36, the operator will be notified of the deviation in the orientation of the system 30. The vibration continues until the system 30 is oriented within the predetermined threshold or the operator releases the actuator 38. In an embodiment, it is desired for the plane 136 to be within 10-15 degrees of horizontal (relative to the ground) about the yaw, roll and pitch axes.

Figure 11:
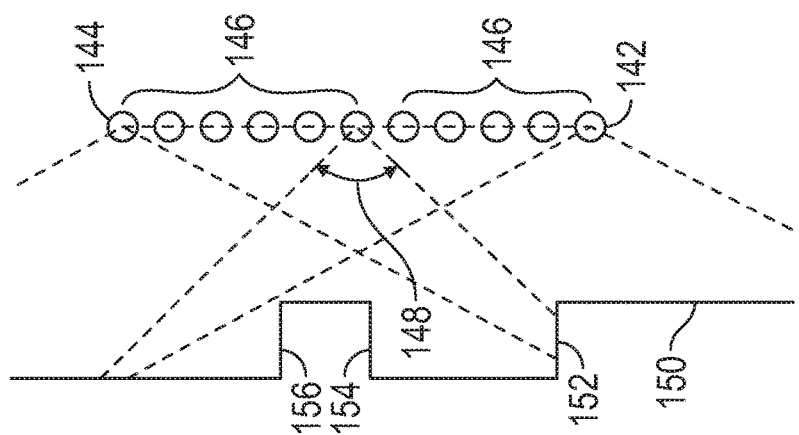

In an embodiment, the 2D scanner 50 makes measurements as the system 30 is moved about an environment, such from a first position 142 to a second registration position 144 as shown in FIG. 11. In an embodiment, 2D scan data is collected and processed as the system 30 passes through a plurality of 2D measuring positions 146. At each measuring position 146, the 2D scanner 50 collects 2D coordinate data over an effective FOV 148. Using methods described in more detail below, the controller 68 uses 2D scan data from the plurality of 2D scans at positions 146 to determine a position and orientation of the system 30 as it is moved about the environment. In an embodiment, the common coordinate system is represented by 2D Cartesian coordinates x, y and by an angle of rotation θ relative to the x or y axis ("theta"). In an embodiment, the x and y axes lie in the plane of the 2D scanner and may be further based on a direction of a "front" of the 2D scanner 50.

Figure 12:
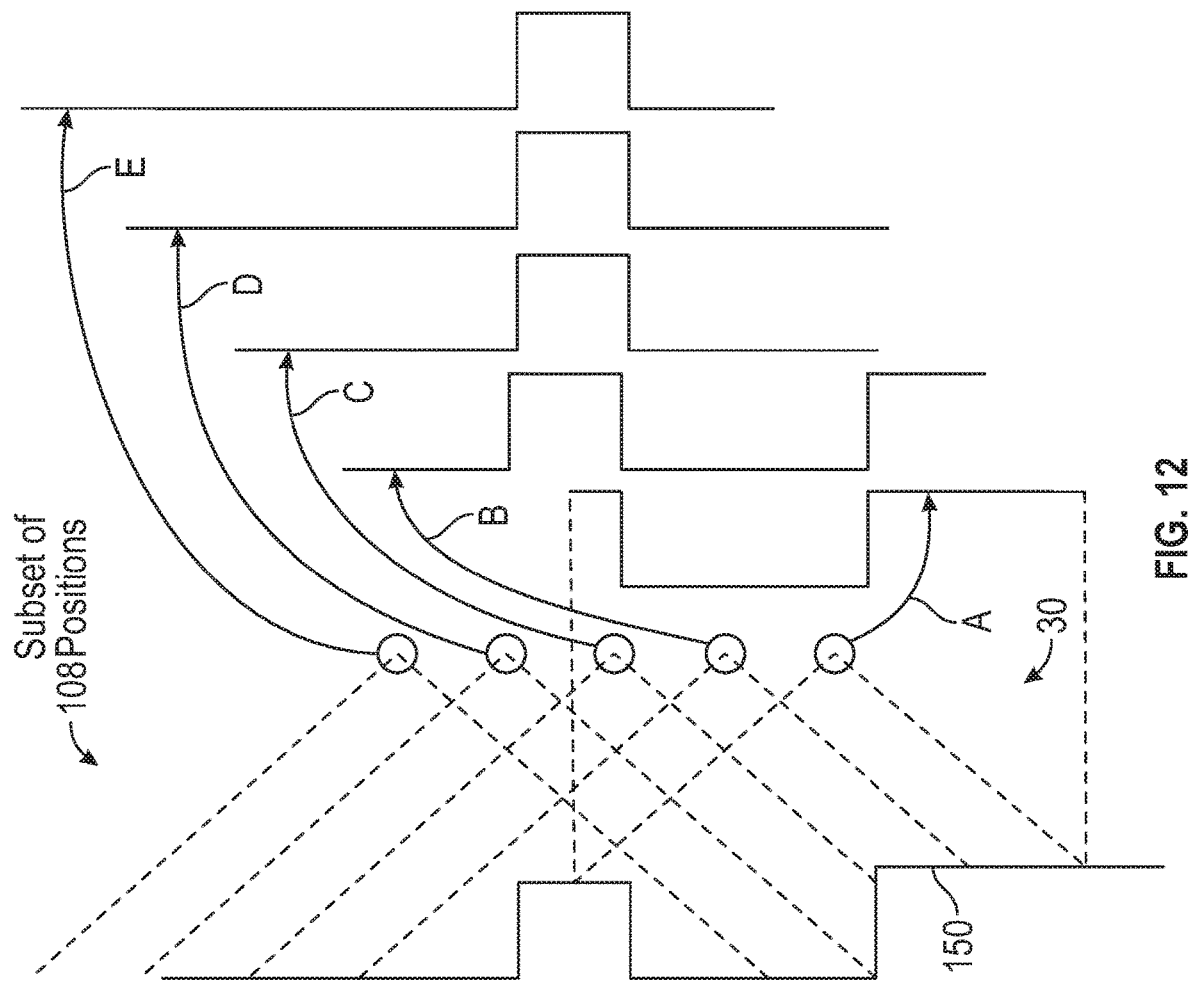
FIG. 11-13 are schematic illustrations of the operation of system of FIG. 9 in accordance with an embodiment.

FIG. 12 shows the 2D system 30 collecting 2D scan data at selected positions 108 over an effective FOV 110. At different positions 146, the 2D scanner 50 captures a portion of the object 150 marked A, B, C, D, and E. FIG. 121 shows 2D scanner 50 moving in time relative to a fixed frame of reference of the object 150.

Figure 13:
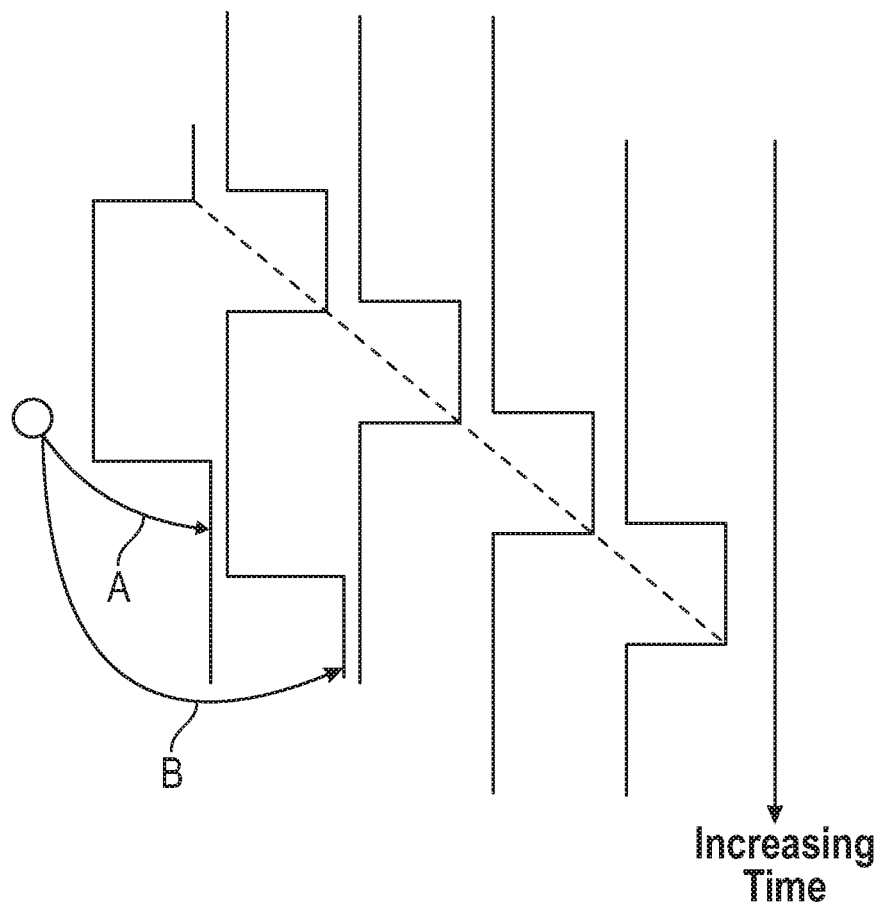

FIG. 13 includes the same information as FIG. 12 but shows it from the frame of reference of the system 30 rather than the frame of reference of the object 150. FIG. 13 illustrates that in the system 30 frame of reference, the position of features on the object change over time. Therefore, the distance traveled by the system 30 can be determined from the 2D scan data sent from the 2D scanner 50 to the controller 68.

As the 2D scanner 50 takes successive 2D readings and performs best-fit calculations, the controller 68 keeps track of the translation and rotation of the 2D scanner 50, which is the same as the translation and rotation of the system 30. In this way, the controller 68 is able to accurately determine the change in the values of x, y, θ as the system 30 moves from the first position 142 to the second position 144.

In an embodiment, the controller 68 is configured to determine a first translation value, a second translation value, along with first and second rotation values (yaw, roll, pitch) that, when applied to a combination of the first 2D scan data and second 2D scan data, results in transformed first 2D data that closely matches transformed second 2D data according to an objective mathematical criterion. In general, the translation and rotation may be applied to the first scan data, the second scan data, or to a combination of the two. For example, a translation applied to the first data set is equivalent to a negative of the translation applied to the second data set in the sense that both actions produce the same match in the transformed data sets. An example of an "objective mathematical criterion" is that of minimizing the sum of squared residual errors for those portions of the scan data determined to overlap. Another type of objective mathematical criterion may involve a matching of multiple features identified on the object. For example, such features might be the edge transitions 152, 154, and 156 shown in FIG. 11. The mathematical criterion may involve processing of the raw data provided by the 2D scanner 50 to the controller 68, or it may involve a first intermediate level of processing in which features are represented as a collection of line segments using methods that are known in the art, for example, methods based on the Iterative Closest Point (ICP). Such a method based on ICP is described in Censi, A., "An ICP variant using a point-to-line metric," IEEE International Conference on Robotics and Automation (ICRA) 2008, which is incorporated by reference herein.

In an embodiment, assuming that the plane 136 of the light beam from 2D scanner 50 remains horizontal relative to the ground plane, the first translation value is dx, the second translation value is dy, and the first rotation value is dθ. If the first scan data is collected with the 2D scanner 50 having translational and rotational coordinates (in a reference coordinate system) of $(x_1, y_1, \theta_1)$, then when the second 2D scan data is collected at a second location the coordinates are given by $(x_2, y_2, \theta_2) = (x_1 + dx, y_1 + dy, \theta_1 + d\theta)$. In an embodiment, the controller 68 is further configured to determine a third translation value (for example, dz) and a second and third rotation values (for example, pitch and roll). The third translation value, second rotation value, and third rotation value may be determined based at least in part on readings from the IMU 74.

The 2D scanner 50 collects 2D scan data starting at the first position 142 and more 2D scan data at the second position 144. In some cases, these scans may suffice to determine the position and orientation of the system 30 at the second position 144 relative to the first position 142. In other cases, the two sets of 2D scan data are not sufficient to enable the controller 68 to accurately determine the first translation value, the second translation value, and the first rotation value. This problem may be avoided by collecting 2D scan data at intermediate scan positions 146. In an embodiment, the 2D scan data is collected and processed at regular intervals, for example, once per second. In this way, features in the environment are identified in successive 2D scans at positions 146. In an embodiment, when more than two 2D scans are obtained, the controller 68 may use the information from all the successive 2D scans in determining the translation and rotation values in moving from the first position 142 to the second position 144. In another embodiment, only the first and last scans in the final calculation, simply using the intermediate 2D scans to ensure proper correspondence of matching features. In most cases, accuracy of matching is improved by incorporating information from multiple successive 2D scans.

It should be appreciated that as the system 30 is moved beyond the second position 144, a two-dimensional image or map of the environment being scanned may be generated.

Figure 14:
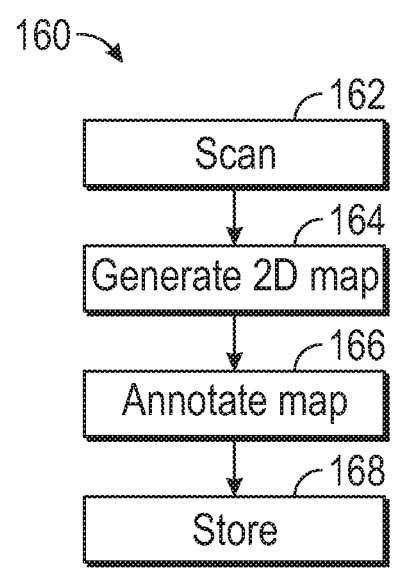
FIG. 14 is a flow diagram of a method of generating a two-dimensional map of an environment.
Figure 15:
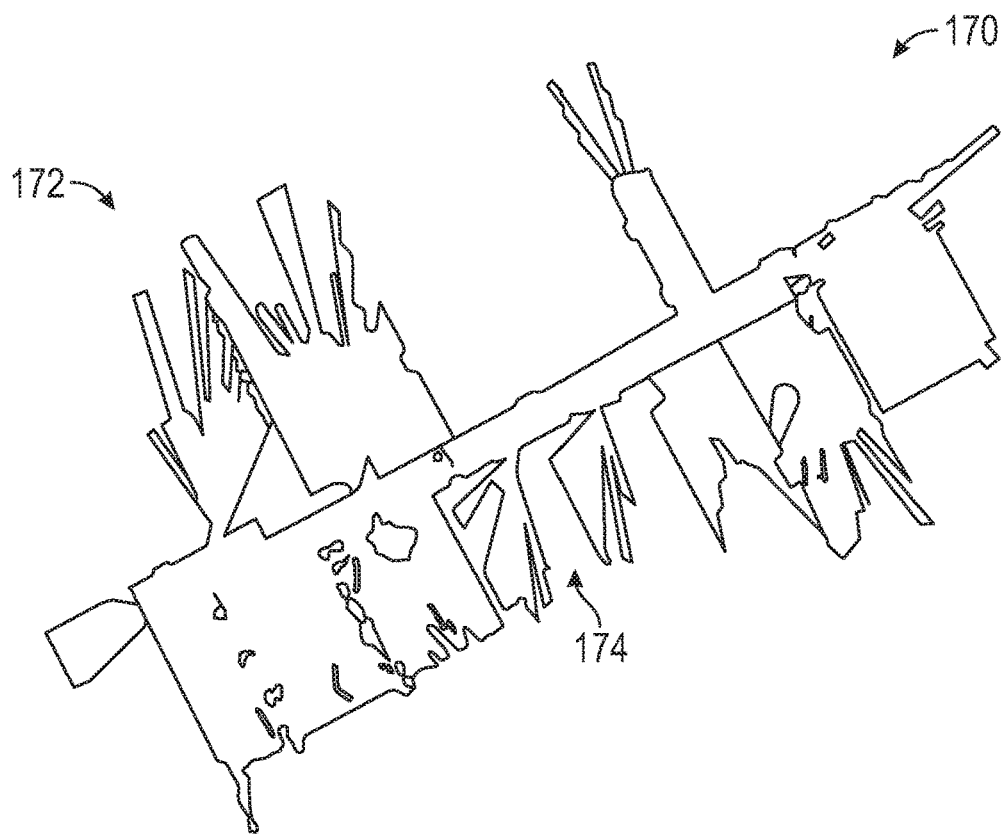
FIGS. 15-16 are plan views of stages of a two-dimensional map generated with the method of FIG. 14 in accordance with an embodiment.

Referring now to FIG. 14, a method 160 is shown for generating a two-dimensional map with annotations. The method 160 starts in block 162 where the facility or area is scanned to acquire scan data 170, such as that shown in FIG. 15. The scanning is performed by carrying the system 30 through the area to be scanned. The system 30 measures distances from the system 30 to an object, such as a wall for example, and also a pose of the system 30 in an embodiment the user interacts with the system 30 via actuator 38. In the illustrated embodiments, the mobile device 43 provides a user interface that allows the operator to initiate the functions and control methods described herein. Using the registration process desired herein, the two dimensional locations of the measured points on the scanned objects (e.g. walls, doors, windows, cubicles, file cabinets etc.) may be determined. It is noted that the initial scan data may include artifacts, such as data that extends through a window 172 or an open door 174 for example. Therefore, the scan data 170 may include additional information that is not desired in a 2D map or layout of the scanned area.

Figure 16:
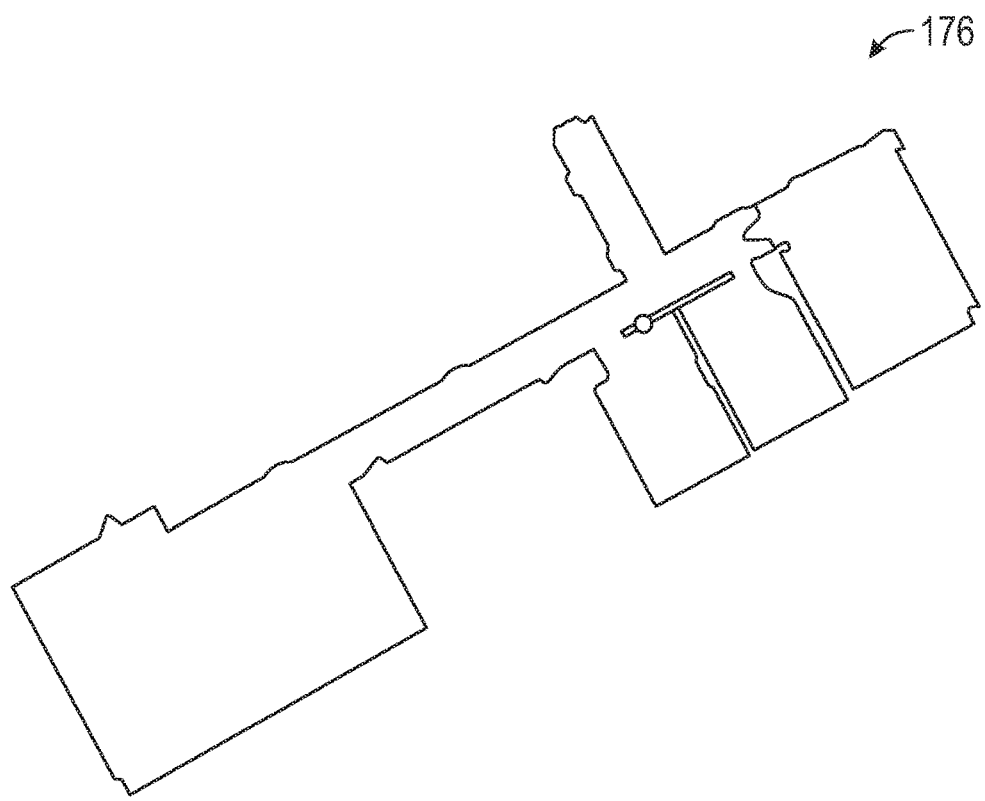

The method 160 then proceeds to block 164 where a 2D map 176 is generated of the scanned area as shown in FIG. 16. The generated 2D map 176 represents a scan of the area, such as in the form of a floor plan without the artifacts of the initial scan data. It should be appreciated that the 2D map 176 may be utilized directly by an architect, interior designer or construction contractor as it represents a dimensionally accurate representation of the scanned area. In the embodiment of FIG. 14, the method 160 then proceeds to block 166 where optional user-defined annotations are made to the 2D maps 176 to define an annotated 2D map that includes information, such as dimensions of features, the location of doors, the relative positions of objects (e.g. liquid oxygen tanks, entrances/exits or egresses or other notable features such as but not limited to the location of automated sprinkler systems, knox or key boxes, or fire department connection points ("FDC"). In some geographic regions, public safety services such as fire departments may keep records of building or facility layouts for use in case of an emergency as an aid to the public safety personnel in responding to an event. It should be appreciated that these annotations may be advantageous in alerting the public safety personnel to potential issues they may encounter when entering the facility, and also allow them to quickly locate egress locations.

Once the annotations of the 2D annotated map are completed, the method 160 then proceeds to block 168 where the 2D map is stored in memory, such as nonvolatile memory 86 for example. The 2D map may also be stored in a network accessible storage device or server so that it may be accessed by the desired personnel.

Figure 17:
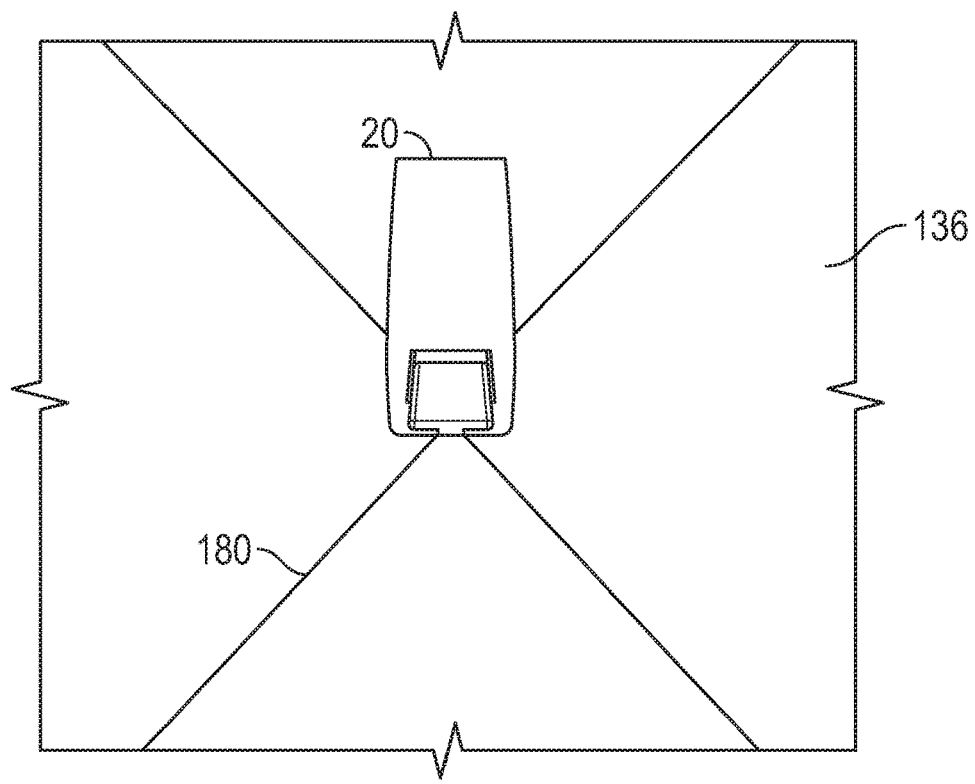
FIG. 17-18 are schematic views of the operation of the system of FIG. 9 in accordance with an embodiment.
Figure 18:
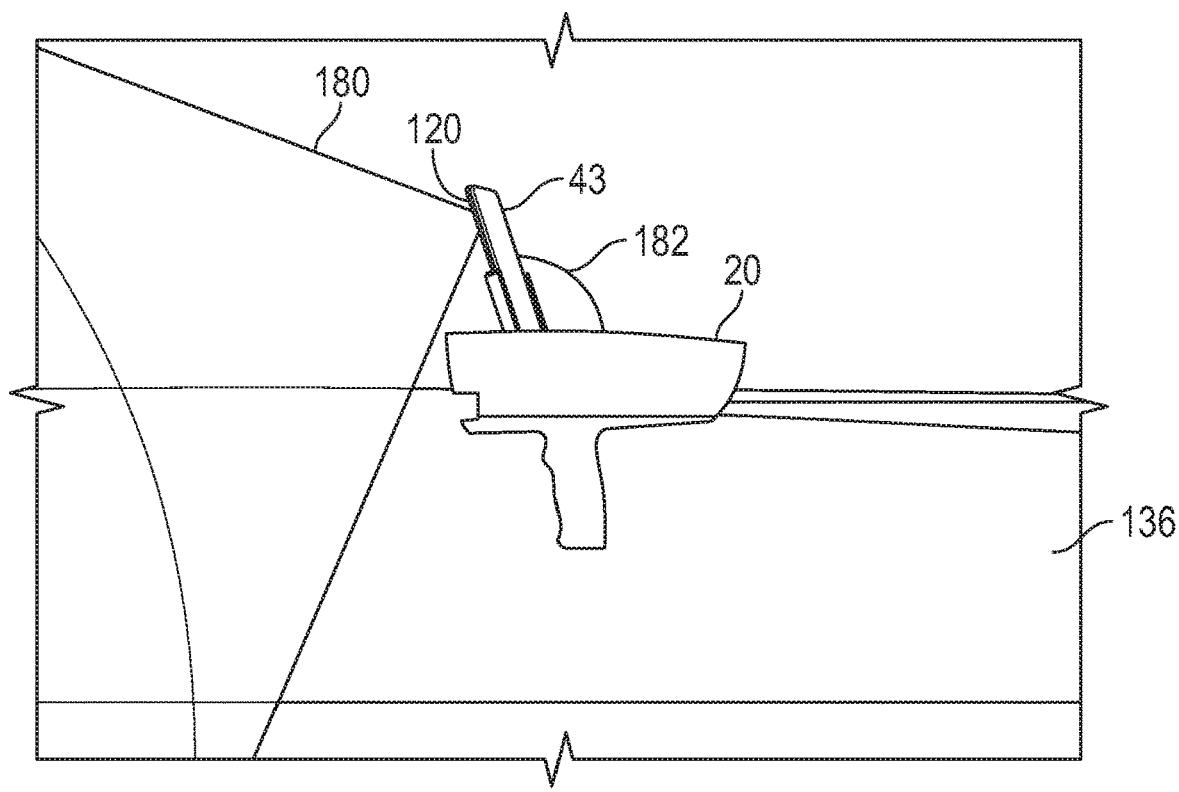

Referring now to FIG. 17 and FIG. 18 an embodiment is illustrated with the mobile device 43 coupled to the system 20. As described herein, the 2D scanner 50 emits a beam of light in the plane 136. The 2D scanner 50 has a field of view (FOV) that extends over an angle that is less than 360 degrees. In the exemplary embodiment, the FOV of the 2D scanner is about 270 degrees. In this embodiment, the mobile device 43 is coupled to the housing 32 adjacent the end where the 2D scanner 50 is arranged. The mobile device 43 includes a forward facing camera 120. The camera 120 is positioned adjacent a top side of the mobile device and has a predetermined field of view 180. In the illustrated embodiment, the holder 41 couples the mobile device 43 on an obtuse angle 182. This arrangement allows the mobile device 43 to acquire images of the floor and the area directly in front of the system 20 (e.g. the direction the operator is moving the system 20).

In embodiments where the camera 120 is a RGB-D type camera, three-dimensional coordinates of surfaces in the environment may be directly determined in a mobile device coordinate frame of reference. In an embodiment, the holder 41 allows for the mounting of the mobile device 43 in a stable position (e.g. no relative movement) relative to the 2D scanner 50. When the mobile device 43 is coupled to the housing 32, the processor 78 performs a calibration of the mobile device 43 allowing for a fusion of the data from sensors 108 with the sensors of system 20. As a result, the coordinates of the 2D scanner may be transformed into the mobile device coordinate frame of reference or the 3D coordinates acquired by camera 120 may be transformed into the 2D scanner coordinate frame of reference.

In an embodiment, the mobile device is calibrated to the 2D scanner 50 by assuming the position of the mobile device based on the geometry and position of the holder 41 relative to 2D scanner 50. In this embodiment, it is assumed that the holder that causes the mobile device to be positioned in the same manner. It should be appreciated that this type of calibration may not have a desired level of accuracy due to manufacturing tolerance variations and variations in the positioning of the mobile device 43 in the holder 41. In another embodiment, a calibration is performed each time a different mobile device 43 is used. In this embodiment, the user is guided (such as via the user interface 110) to direct the system 30 to scan a specific object, such as a door, that can be readily identified in the laser readings of the system 30 and in the camera-sensor 120 using an object recognition method.

Figure 19:
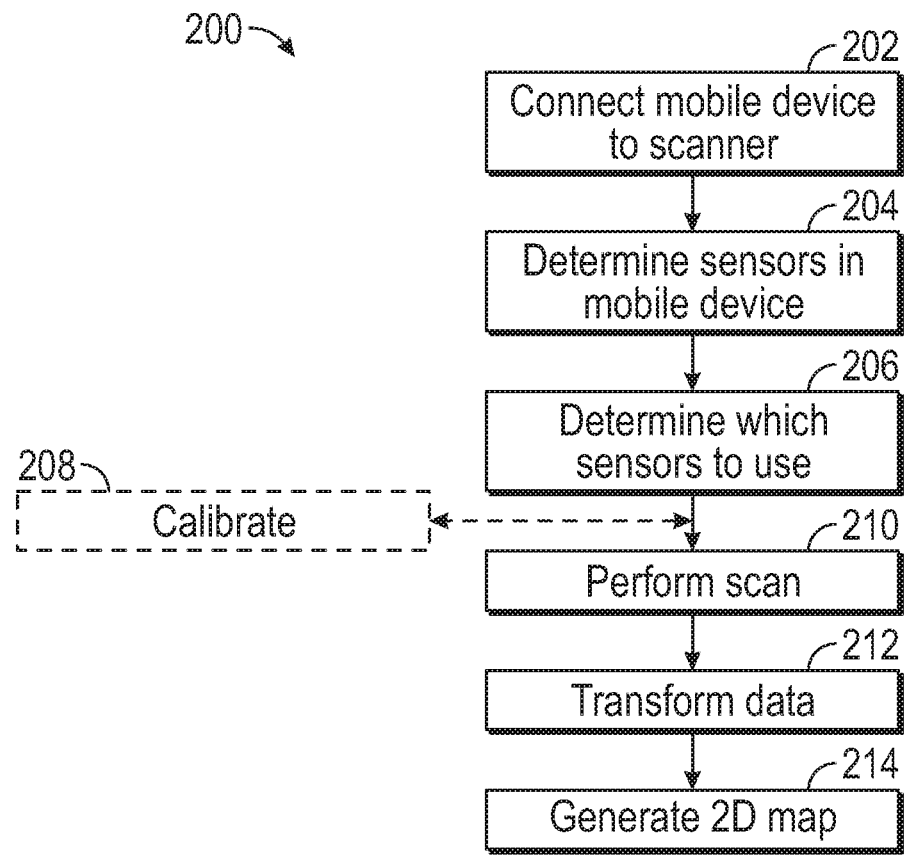
FIG. 19 is a flow diagram of a method of generating a two-dimensional map using the system of FIG. 9 in accordance with an embodiment.

Referring now to FIG. 19, a method 200 is provided for generating a 2D map of an environment. The method 200 begins in block 202 where the operator couples the mobile device 43 to the holder 41. In an embodiment, the coupling includes forming a communication connection between the processor 78 and the processor 104. This communication connection allows the processors 78, 104 to exchange data, including sensor data, therebetween. The method 200 then proceeds to block 204 where information regarding the sensors 108 is transmitted to the processor 78. The information transmitted includes the type of sensors (e.g. accelerometer) and performance characteristics or parameters of the sensor (e.g. dynamic range, frequency response, sensitivity (mV/g) temperature sensitivity, or temperature range).

The method 200 then proceeds to block 206 where the processor 78 compares the sensors 108 with the corresponding sensors in the system 20. In an embodiment, this comparison includes comparing performance characteristics or parameters and determining which sensor would provide a desired accuracy of the scan. It should be appreciated that this comparison is performed on a sensor by sensor basis. In some embodiments, the data used for tracking and pose may be a combination of the sensors from the mobile device 43 and the system 20. For example, the accelerometer 122 may be used in combination with the gyroscope 96 and compass 98 for determining tracking and pose.

In an embodiment, once the sensors are selected the method 200 a calibration step is performed in block 208. As discussed herein, the calibration step allows the transforming of data between the mobile device coordinate frame of reference and the 2D scanner coordinate frame of reference.

The method 200 then proceeds to block 210 where the scan is performed by moving the system 20 (with mobile device 43 attached) about the environment. As the scan is being performed (e.g. the 2D scanner is emitting and receiving reflected light and determining distances), the method 200 is transforming data in block 212 into a common frame of reference, such as the 2D scanner frame of reference for example, so that coordinates of the points of surfaces in the environment may be determined. As the scan is being performed, the position and pose of the system 20 is determined on a periodic, aperiodic or continuous basis as described herein.

Once the scan is completed, the method 200 proceeds to block 214 where the 2D map is generated of the scanned area. It should be appreciated that in embodiments where the camera 120 is a 3D camera or RGB-D type camera, a 3D map of the environment may be generated.

It should be appreciated that while embodiments herein describe the performance of operational control methods by the processor 78, this is for exemplary purposes and the claims should not be so limited. In other embodiments, the operation control methods may be performed by the processor 104 or a combination of the processor 78 and the processor 104.

Figure 20:
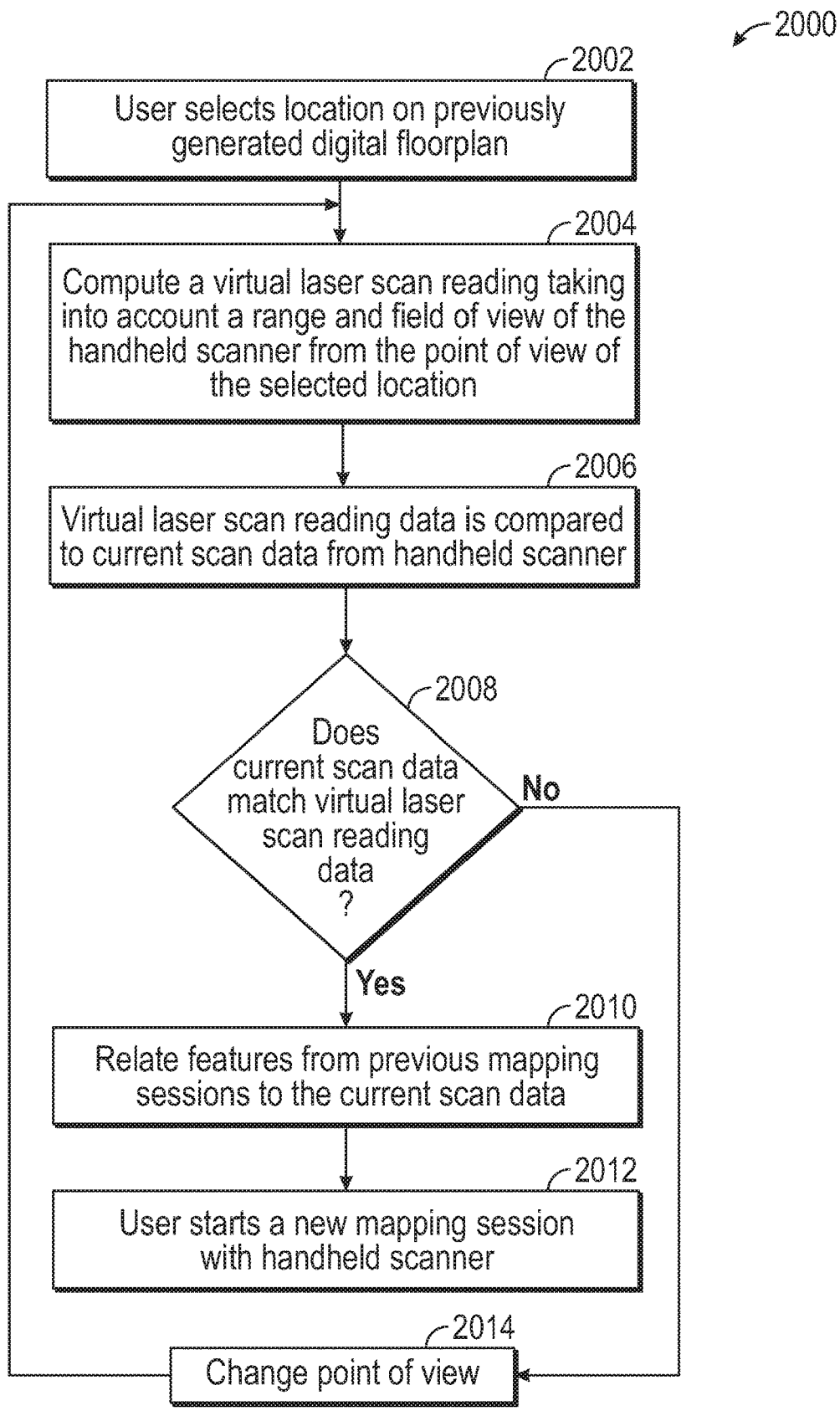
FIG. 20 is a flow diagram of a method of matching a current location of a handheld scanning device to a location on a previously generated floorplan in accordance with an embodiment.

Turning now to FIG. 20, a flow diagram of a method 2000 of matching a current location of a handheld scanning device to a location on a previously generated floorplan, or re-localization, is generally shown in accordance with an embodiment. The processing shown in FIG. 20 can be performed for example, by controller 68 and the handheld scanning device can be implemented by system 30. It should be appreciated that in other embodiments the processing shown in FIG. 20 may be performed by any suitable computing device, including but not limited to the cellular phone 43, a computer, a laptop, a table, a distributed computing system, or a cloud computing system for example. At block 2002, a previously generated map(s), or floor plan, of the environment is shown to the user via a user interface on the handheld scanning device, such as a user interface 110 coupled to controller 68. In an embodiment, the previously generated map has all rooms of the floorplan segmented and marked. The user selects (via the user interface) a room where he/she intends to start the new mapping session and is asked to indicate a location (such as by touching the display 110) in the room where the handheld scanning device will be located at the start of the new mapping session. At block 2004, a virtual laser scan reading is computed based on the selected location. In an embodiment, the virtual laser scan reading is generated by taking into account the range and field of view of the handheld scanning device from the selected location. The generated virtual laser scan reading data is compared to current scan data at block 2006. In an embodiment, the result of the comparison is a number between zero and one, with one being a perfect match and zero being no match at all.

Turning now to block 2008 of FIG. 20, it is determined whether the generated virtual laser scan reading data matches the current scan data. In an embodiment, a match occurs when the result of the comparison at block 2008 meets a predetermined or programmable threshold value. For example, when the result of the comparison is a value between zero and one as described previously, a match may occur when the value is over 0.75 or over 0.9 or over some other value depending on the accuracy desired. Other scales and methods of computing a match can be implemented by other embodiments. In an embodiment, the virtual laser scan reading data is on a continuous basis, a periodic basis, or an aperiodic basis with the current scan data to determine when a match exists.

If it is determined at block 2008 that the generated virtual scan reading data does not match the current scan data, then processing continues at block 2014 where the point of view of the virtual handheld scanning device is modified. In an embodiment this is performed by changing the point of view represented by modifying one or all of the x, y, and theta values associated with the current point of view of the virtual handheld scanning device. Processing then continues at block 2004 with a new virtual laser scan reading being computed from the modified point of view. This process, performed by blocks 2014 and 2004-2006, of iteratively modifying one, two, or all of the x, y, and theta values associated with a current point of view of the virtual handheld scanning device is continued until it is determined at block 2008 that the current scan data does match the virtual laser scan reading data.

If it is determined at block 2008 that the generated virtual scan reading data matches the current scan data, then processing continues at block 2010 where features from a map(s) captured during a previous mapping session are related to the current scan data to localize the handheld scanning device to the map(s). At block 2012, the user can add new objects (e.g., photographs, documents) to a map(s) from a previous mapping session and/or the user can start a new mapping session. The map obtained from the new mapping session will be fully related to a map(s) from a previous mapping session. In addition, or alternatively, the user can remap portions of the floorplans generated in previous mapping sessions.

Other methods of matching a current location of a handheld scanning device to a location on a previously generated floorplan can be implemented by exemplary embodiments. For example, the user can be asked to start a new mapping session at roughly the same starting point as the last mapping session. The user can be presented, via a user interface, with a floorplan that shows the starting location of a previous mapping session. The user can move to the indicated starting location (such as by touching the display 110) and start the new mapping session. When the new mapping session is ended, both maps from the previous mapping station and the new mapping session can be processed to identify their relative poses using a technique such as root mean square (RMS) and/or Monte Carlo localization. Once the relative position between the new and the old map is known, features previously mapped can now be matched with features. In addition, portions of the floorplan generated in the previous mapping session can be remapped.

Another method of matching a current location of a handheld scanning device to a location on a previously generated floorplan implemented by exemplary embodiments utilizes smartphones that are equipped with powerful cameras and with enough process power for augmented reality (AR) applications. AR frameworks that rely on visual simultaneous localization and mapping methods can be executed on a smartphone and used to track the smartphone position in the environment and to re-localize it. Thus, in embodiments where a smartphone is mounted on the handheld scanning device, such as system 30 of FIG. 1 which includes smartphone 43, the smartphone can be utilized to re-localize the handheld scanning device between different mapping sessions. Examples of commercially available AR frameworks that can be utilized include, but are not limited to ARKit from Apple, Inc., and ARCore from Google. Once the relative position between the new and the old map is known, features previously mapped can now be matched with features. In addition, portions of the floorplan generated in the previous mapping session can be remapped.

Figure 21:
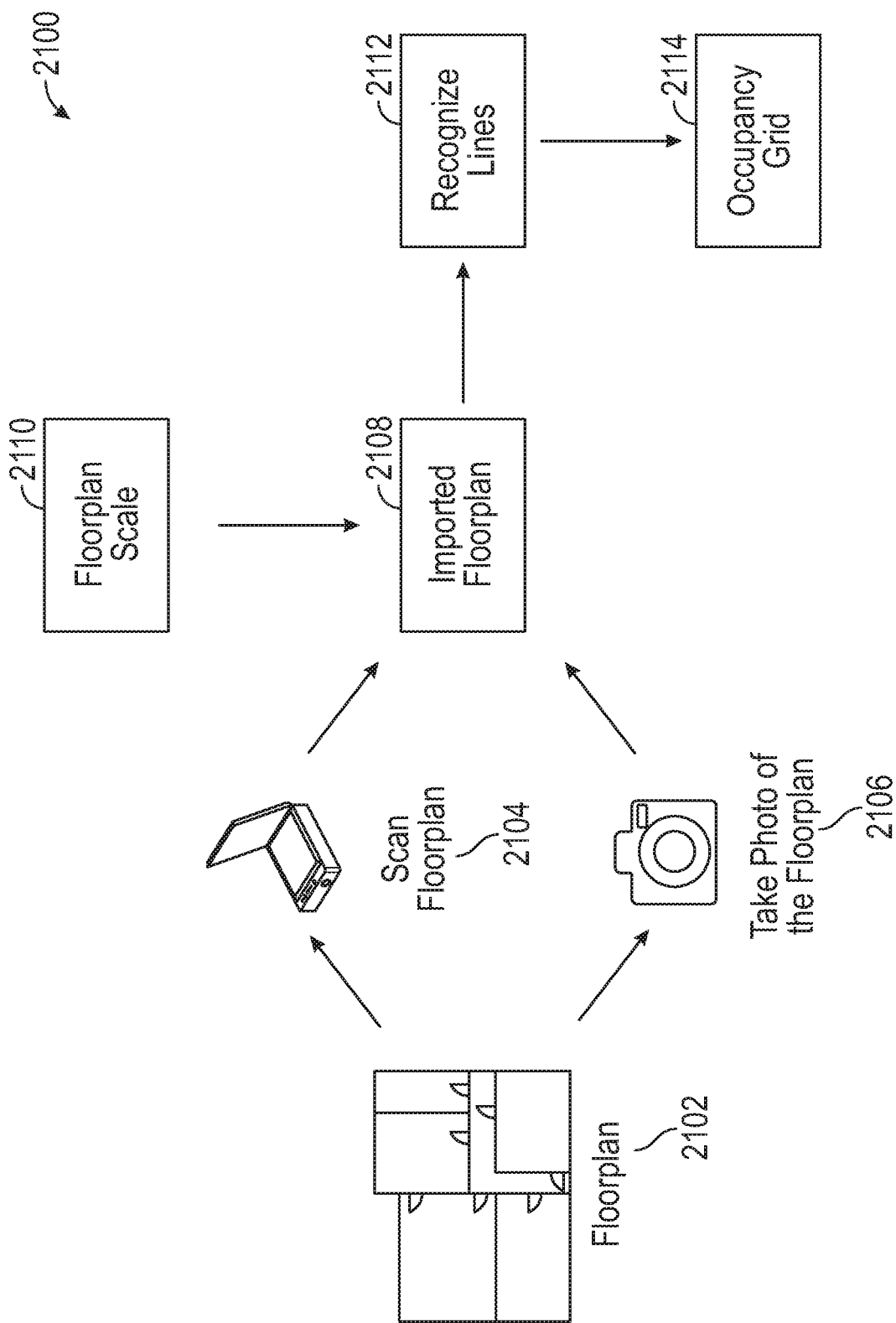
FIG. 21 is a block diagram of a process of importing an existing floorplan and creating an occupancy grid in accordance with an embodiment.

Turning now to FIG. 21, a block diagram 2100 of a process of importing a pre-existing floorplan 2012 and creating an occupancy grid 2114 is generally shown in accordance with an embodiment. As shown in FIG. 21, a pre-existing floorplan 2102 is imported either by scanning 2104 or by taking a photograph 2106 of the pre-existing floorplan 2110 to generate an imported floorplan 2108. The imported floorplan 2108 is updated based on a scale of the pre-existing floorplan 2110. A line recognition method 2112 is applied over the imported image 2108 to remove artifacts and to generate the occupancy grid 2114. In an embodiment, the 2D map is represented as a grid comprised of a plurality of cells that is superimposed on a representation of the area being scanned. This grid, sometimes referred to as an occupancy grid, has cells with one of three values. The cell may be occupied (e.g. a location of a wall or a door), the cell may be free (e.g. no structure at that location), or the cell may be "unknown", which lies in an area that has not yet been scanned. In an embodiment, each cell of the grid is five centimeters per side. It should be appreciated that this is for exemplary purposes and the claimed invention should not be so limited. In other embodiments, the size of the cell may be larger, smaller or user defined.

The scale of the pre-existing floorplan 2110 is used when converting the imported floorplan 2108 into the occupancy grid 2114. If the scale of the pre-existing floorplan 2110 is not available, the resolution of the occupancy grid 2114 and its dimensions cannot be converted in real world coordinates. Generally, the scale of a floorplan is written in the document and thus, the scale of the existing floorplan 2110 is typically available when the pre-existing floorplan 2102 is imported by scanning 2104. However, when the pre-existing floorplan 2102 is imported by taking a photograph 2106, the scale of the pre-existing floorplan 2110 has to be supplied in order to create the occupancy grid 2114.

Figure 22:
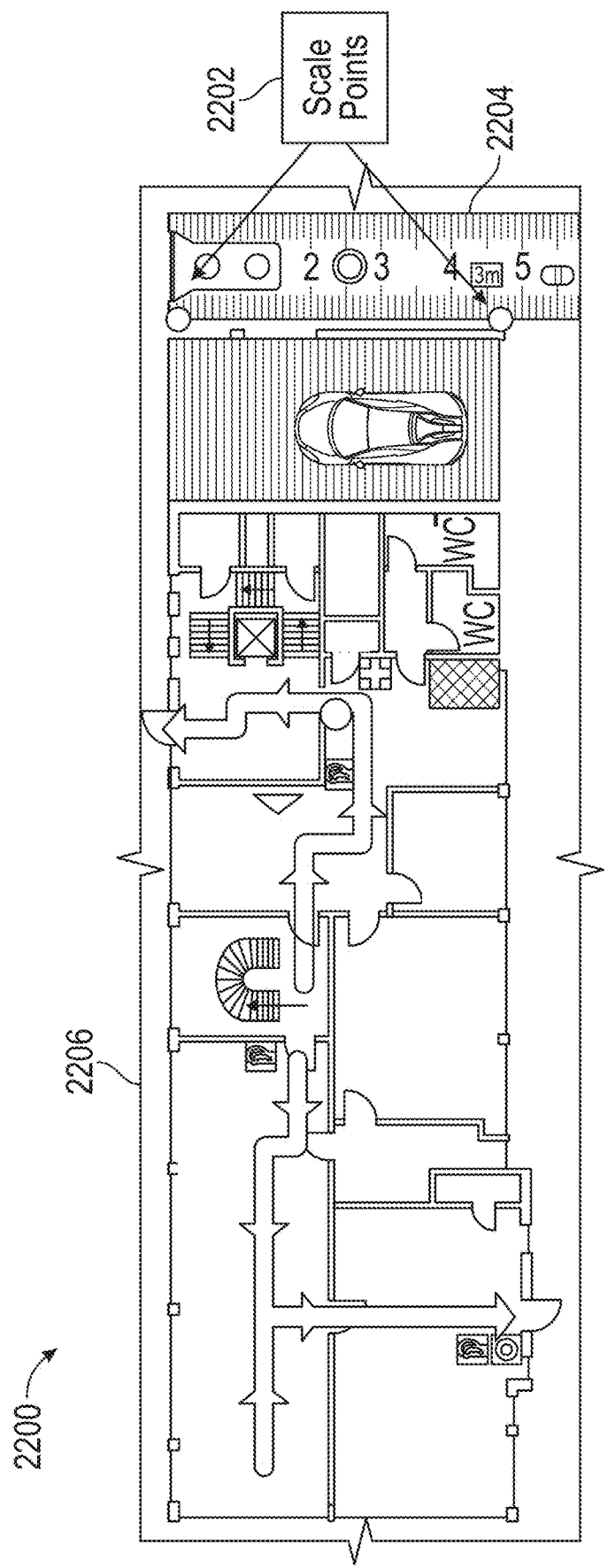
FIG. 22 is a block diagram of an image of a floorplan with a ruler to identify the scale of the floorplan in accordance with an embodiment.

Turning now to FIG. 22, a block diagram 2200 of an image of a floorplan 2206 with a ruler 2204 to identify the scale of the floorplan is generally shown in accordance with an embodiment. As shown in FIG. 22, the user takes a photograph with a scale or ruler next to the image of a floorplan 2206. More accurate results are provided when the photograph is taken with the camera parallel to the floorplan (as much as possible). The user selects two points, or scale points 2202, in the image of a floorplan 2206 inputs the actual distance between them in the building, or environment, via a user interface. Based on the ruler 2204 and the actual distance between the scale points 220, the handheld scanning device calculates the scale automatically and computes an occupancy grid, such as occupancy grid 2114 of FIG. 21. Embodiments described above can be used to localize a handheld scanning device to the floorplan as described by an occupancy grid, such as occupancy grid 2114 of FIG. 21.

Figure 23:
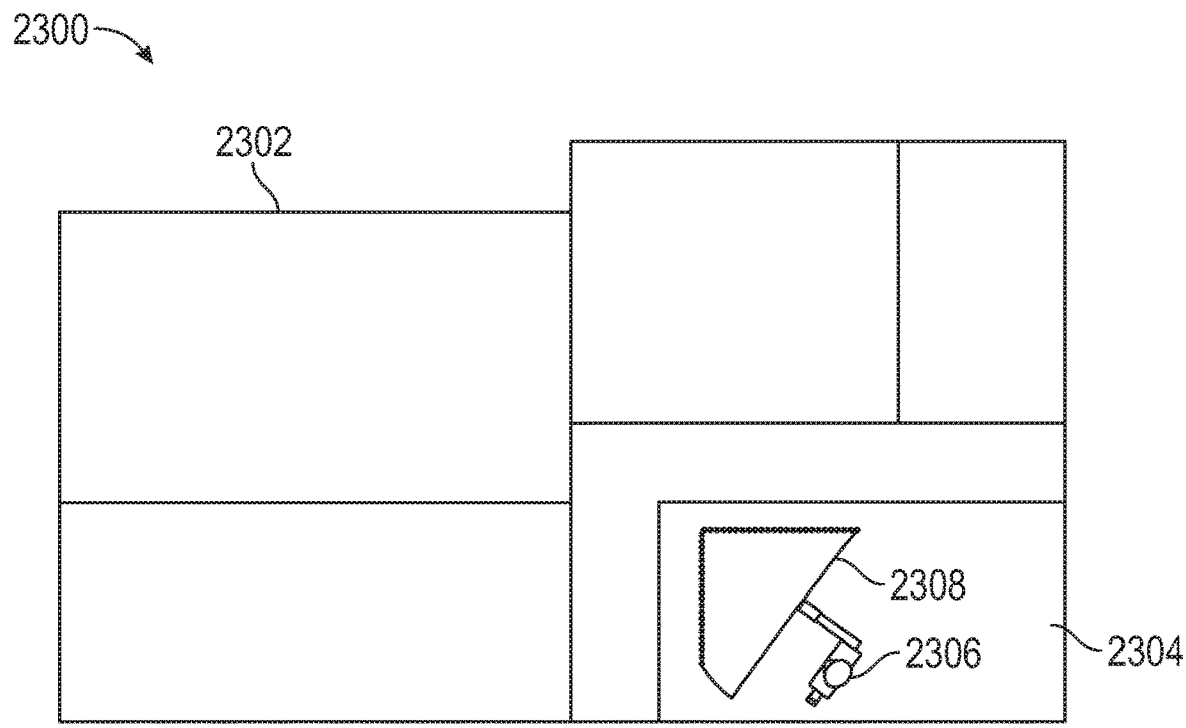
FIG. 23 is a block diagram of a generated occupancy grid with an incorrect scale in accordance with an embodiment.
Figure 24:
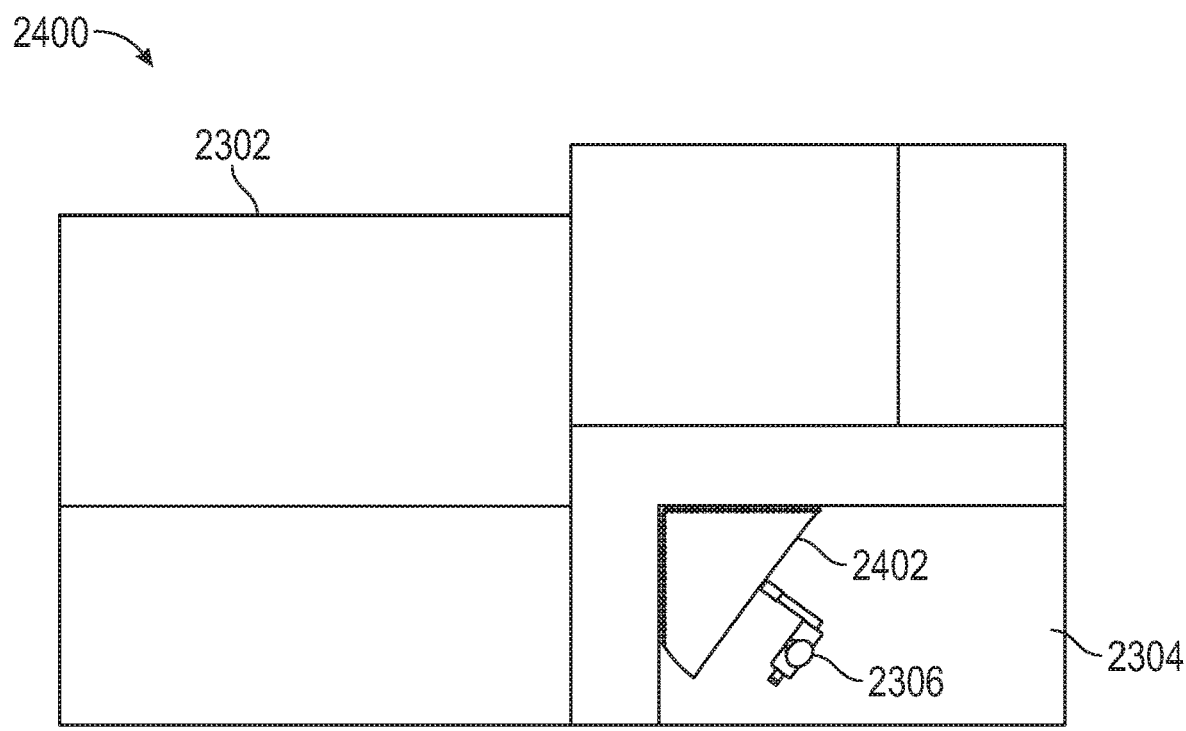
FIG. 24 is a block diagram of a generated occupancy grid with a correct scale in accordance with an embodiment.

Turning now to FIGS. 23 and 24, a block diagram 2300 of a generated occupancy grid with an unknown or incorrect scale, and a block diagram 2400 of a generated occupancy grid with a correct scale are generally shown in accordance with an embodiment. In the embodiment shown in FIGS. 23 and 24, a scale of the non-digital floorplan 2302 is provided by showing the user, via a user interface, current laser readings from a handheld scanner device 2306 on the generated occupancy grid 2304. FIG. 23 shows a top view of the laser readings 2308 over the room 2304. As shown in FIG. 23 the current laser readings 2308 do not match the size of the room 2304. In other words, the corner of the laser readings 2308 does not overlay or overlap with the corner of room 2304. The user can increase the scale though a user interface of the handheld digital scanner until the data matches the occupancy grid as show in FIG. 24. To increase or decrease the scale a "+" and "−" button or a sliding bar can be adjusted by the use via the user interface. As shown in FIG. 24, the current laser readings 2402 of the handheld scanner device 2306 match the size of the room 2304. Once the scale is adjusted as shown in FIG. 24, the user is now able to overlay the current measurements from the handheld scanning device with the original non-digital floorplan and find, for example, differences between the actual data and (older) floorplans. In this manner new floorplans can be generated and compared directly with the old (e.g., non-digitized paper versions) floorplans. In addition, notes and other objects in the project without having to map everything again.

The term "about" or "substantially" is intended to include the degree of error associated with measurement of the particular quantity based upon the equipment available at the time of filing the application.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A system for automatic re-localization of a handheld scanning device in a previously mapped environment, the system comprising:
a two-dimensional (2D) scanner comprising:
a light source, an image sensor and a controller, the light source steers a beam of light within a first plane to illuminate object points in the environment, the image sensor is arranged to receive light reflected from the object points, the controller being operable to determine a distance value to at least one of the object points; and
an inertial measurement unit fixedly coupled relative to the 2D scanner and having a first sensor, the inertial measurement unit generating a signal in response a change in position or orientation of the housing, the first sensor having a first characteristic;
one or more processors operably coupled to the 2D scanner, the one or more processors being responsive to non-transitory executable instructions for performing operations comprising:
determining a current location of the 2D scanner in an environment relative to a location in a previously generated 2D image of the environment that was created based at least in part on an image of a non-digital floorplan;
generating a new 2D image of at least a subset of the environment based at least in part in response to a signal from the first sensor, the at least a subset of the environment comprising the current location of the 2D scanner and at least one other location in the environment; and
combining overlapping portions of the previously generated 2D image and the current 2D image.

2. The system of claim 1, wherein the determining comprises:
computing virtual scan data based at least in part on a point of view of the location in a previously generated 2D image of the environment;
obtaining current scan data from the 2D scanner at the current location;
comparing the virtual scan data to the current scan data; and
based on the virtual scan data not matching the current scan data:
modifying the point of view of the location in a previously generated 2D image of the environment; and
repeating the computing, obtaining, and comparing.

3. The system of claim 2, wherein the virtual scan data matches the current scan data when the virtual scan data is within a threshold value of the current scan data.

4. The system of claim 2, wherein the repeating is performed until the virtual scan data matches the current scan data.

5. The system of claim 1, wherein the system further comprises a mobile computing device coupled to the 2D scanner, and the current location of the 2D scanner relative to a location in a previously generated 2D image is determined by an augmented reality application executing on the mobile computing device.

6. The system of claim 1, wherein the image of the non-digital floorplan is a photograph.

7. The system of claim 1, wherein the floorplan is a floorplan of a building.

8. The system of claim 1, wherein the first sensor is selected from a group comprising: an accelerometer, a gyroscope and a magnetometer.

9. The system of claim 1, wherein the first sensor is a camera.

10. The system of claim 1, wherein the image of the non-digital floorplan includes an image of a scale adjacent the non-digital floorplan.

11. A method for automatic re-localization of a handheld scanning device in a previously mapped environment, the method comprising:
determining a current location of a 2D scanner in an environment relative to a location in a previously generated 2D image of the environment that was created based at least in part on an image of a non-digital floorplan, the 2D scanner comprising: a light source, an image sensor and a controller, the light source steers a beam of light within the first plane to illuminate object points in the environment, the image sensor is arranged to receive light reflected from the object points, the controller being operable to determine a distance value to at least one of the object points; and an inertial measurement unit fixedly coupled relative to the 2D scanner and having a first sensor, the inertial measurement unit generating a signal in response a change in position or orientation of the housing, the first sensor having a first characteristic;
generating a new 2D image of at least a subset of the environment based at least in part in response to a signal from the first sensor, the at least a subset of the environment comprising the current location of the 2D scanner and at least one other location in the environment; and
combining overlapping portions of the previously generated 2D image and the current 2D image.

12. The method of claim 11, wherein the determining comprises:
computing virtual scan data based at least in part on a point of view of the location in a previously generated 2D image of the environment;
obtaining current scan data from the 2D scanner at the current location;
comparing the virtual scan data to the current scan data; and
based on the virtual scan data not matching the current scan data:
modifying point of view of the location in a previously generated 2D image of the environment; and
repeating the computing, obtaining, and comparing.

13. The method of claim 12, wherein the virtual scan data matches the current scan data when the virtual scan data is within a threshold value of the current scan data.

14. The method of claim 12, wherein the repeating is performed until the virtual scan data matches the current scan data.

15. The method of claim 11, wherein the current location of the 2D scanner relative to a location in a previously generated 2D image is determined by an augmented reality application executing on a mobile computing device coupled to the 2D scanner.

16. The method of claim 11, wherein the image of the non-digital floorplan is a photograph.

17. The method of claim 11, wherein the floorplan is a floorplan of a building.

18. The method of claim 11, wherein the image of the non-digital floorplan includes an image of a scale adjacent the non-digital floorplan.

* * * * *